(12) United States Patent
Shoji

(10) Patent No.: US 10,734,219 B2
(45) Date of Patent: Aug. 4, 2020

(54) PLASMA FILM FORMING METHOD

(71) Applicant: ASM IP Holding B.V., Almere (NL)

(72) Inventor: Fumitaka Shoji, Kawasaki (JP)

(73) Assignee: ASM IP Holdings B.V., Almere (NL)

( * ) Notice: Subject to any disclaimer, the term of this patent is extended or adjusted under 35 U.S.C. 154(b) by 0 days.

(21) Appl. No.: 16/142,793

(22) Filed: Sep. 26, 2018

(65) Prior Publication Data
US 2020/0098563 A1 Mar. 26, 2020

(51) Int. Cl.
*H01L 21/02* (2006.01)
*H01J 37/32* (2006.01)
*C23C 16/455* (2006.01)
*C23C 16/40* (2006.01)

(52) U.S. Cl.
CPC ...... *H01L 21/02186* (2013.01); *C23C 16/405* (2013.01); *C23C 16/45542* (2013.01); *H01J 37/3244* (2013.01); *H01J 37/32522* (2013.01); *H01J 37/32853* (2013.01); *H01L 21/0228* (2013.01); *H01L 21/02205* (2013.01); *H01L 21/02274* (2013.01); *H01J 37/32091* (2013.01); *H01J 2237/3321* (2013.01); *H01J 2237/3323* (2013.01)

(58) Field of Classification Search
CPC ......... H01L 21/02186; H01L 21/02274; H01L 21/0228; H01J 37/32853–32862; H01J 37/3244; H01J 37/32522; H01J 37/32091; H01J 2237/3323; C23C 16/45542; C23C 16/45565; C23C 16/405
See application file for complete search history.

(56) References Cited

U.S. PATENT DOCUMENTS

| | | | | |
|---|---|---|---|---|
| 6,635,569 B1 * | 10/2003 | Ameen | ................... | C23C 16/14 438/680 |
| 7,267,842 B2 * | 9/2007 | Wu | ....................... | C23C 14/083 134/1.1 |
| 8,257,790 B2 * | 9/2012 | Narushima | ............... | C23C 8/36 427/248.1 |
| 9,607,837 B1 * | 3/2017 | Namba | ............. | H01L 21/02211 |
| 2002/0029748 A1 * | 3/2002 | Kuwada | .............. | C23C 16/4405 118/724 |
| 2003/0097987 A1 * | 5/2003 | Fukuda | ............... | C23C 16/4405 118/723 E |
| 2006/0096541 A1 * | 5/2006 | Seo | ......................... | C23C 16/34 118/724 |
| 2006/0137608 A1 * | 6/2006 | Choi | ...................... | C23C 16/14 118/715 |
| 2007/0175861 A1 * | 8/2007 | Hwang | ............... | H01J 37/3244 216/67 |
| 2009/0286398 A1 * | 11/2009 | Uesugi | ................... | C23C 16/34 438/686 |

(Continued)

*Primary Examiner* — Zandra V Smith
*Assistant Examiner* — Jeremy J Joy
(74) *Attorney, Agent, or Firm* — Studebaker & Brackett PC

(57) ABSTRACT

Examples of a plasma film forming method include repeating feeding material gas onto a substrate placed on a susceptor via a shower head provided to oppose the susceptor, performing plasma film formation on the substrate by applying high frequency power to the shower head while providing reactant gas onto the substrate, and performing post-purge of discharging the gas used in the plasma film formation while heating the shower head, for a time longer than 0.1 seconds, a plurality of times in this order.

11 Claims, 33 Drawing Sheets

(56) References Cited

U.S. PATENT DOCUMENTS

| | | | |
|---|---|---|---|
| 2010/0279008 A1* | 11/2010 | Takagi | C23C 16/4557 |
| | | | 427/248.1 |
| 2011/0308551 A1* | 12/2011 | Chung | B08B 5/00 |
| | | | 134/22.1 |
| 2015/0099072 A1* | 4/2015 | Takamure | C23C 16/34 |
| | | | 427/577 |
| 2015/0211119 A1* | 7/2015 | Ono | C23C 16/45565 |
| | | | 118/725 |
| 2015/0247238 A1* | 9/2015 | Pasquale | C23C 16/4408 |
| | | | 438/785 |
| 2015/0329970 A1* | 11/2015 | Khan | C23C 16/45565 |
| | | | 118/719 |
| 2015/0348773 A1* | 12/2015 | Zhu | C23C 14/0036 |
| | | | 438/503 |
| 2016/0056037 A1* | 2/2016 | Thombare | H01L 21/02186 |
| | | | 438/770 |
| 2016/0148821 A1* | 5/2016 | Singh | H01J 37/32715 |
| | | | 438/710 |
| 2017/0018477 A1* | 1/2017 | Kato | H01L 23/3192 |
| 2017/0062209 A1* | 3/2017 | Shiba | H01L 21/02178 |
| 2017/0107621 A1* | 4/2017 | Suemori | H01J 37/32082 |
| 2018/0096843 A1* | 4/2018 | Kulshreshtha | C23C 16/45502 |
| 2019/0088475 A1* | 3/2019 | Iwashita | H01L 21/02274 |
| 2019/0211450 A1 | 7/2019 | Adachi et al. | |

* cited by examiner

| | Feed | Source Purge | RF | Post Purge |
|---|---|---|---|---|
| Material Gas | ▓ | | | |
| Reactant Gas | ▓ | ▓ | ▓ | ▓ |
| Carrier Gas | ▓ | ▓ | ▓ | ▓ |
| RF | | | ▓ | |
| Heater | ▓ | ▓ | ▓ | ▓ |

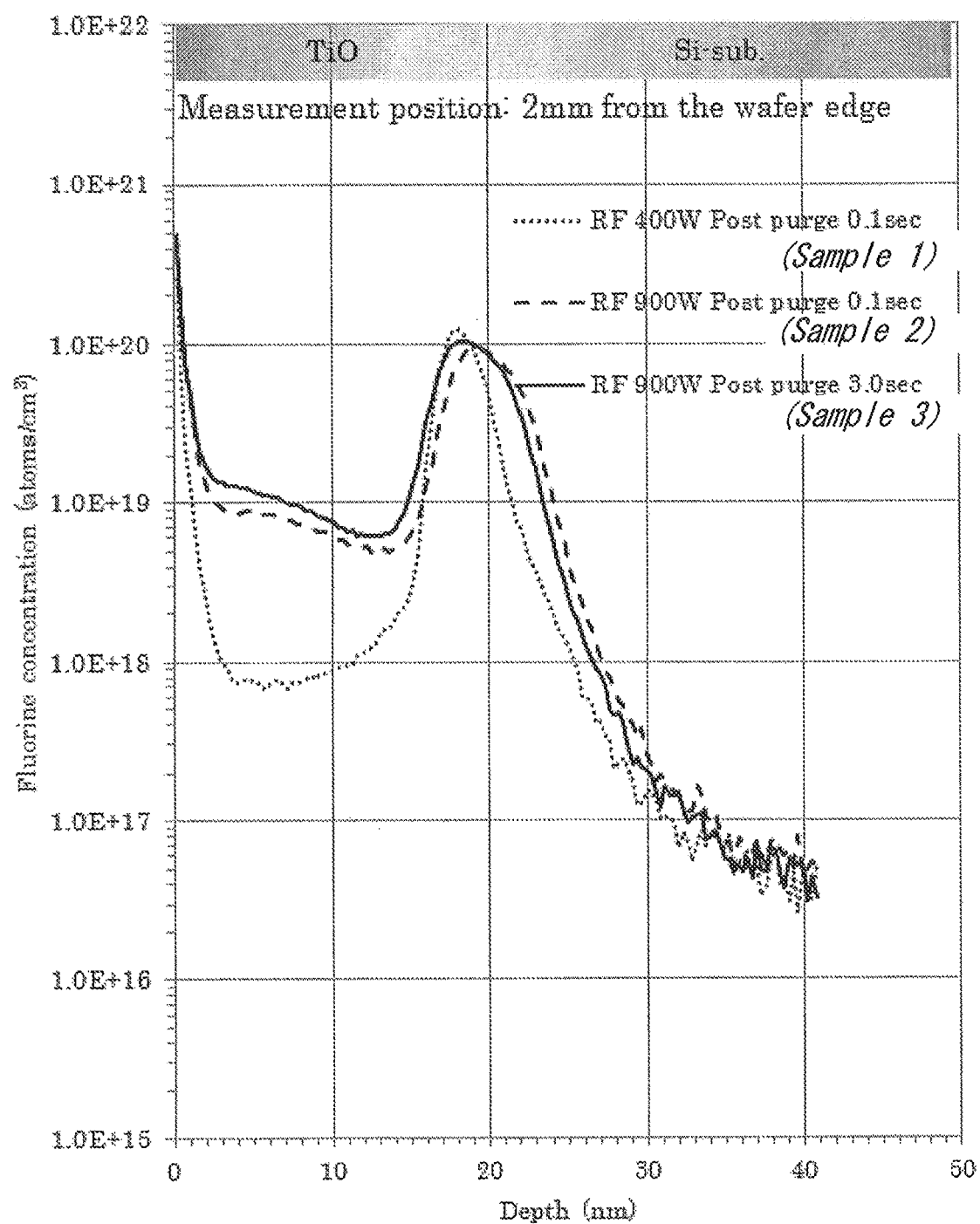

PLASMA FILM FORMING METHOD

TECHNICAL FIELD

Examples are described which relate to a plasma film forming method.

BACKGROUND

A film of TiO2 is sometimes formed on a substrate such as a Si wafer by plasma-enhanced atomic layer deposition (PE-ALD) using tetrakis (dimethylamido) titanium (TD-MAT) and $O_2$. In order to achieve desired film quality, only high frequency power is sometimes made higher, or only an application time of high frequency power is sometimes made longer, without change in film formation conditions such as the amount of feed of a material gas (source) for film formation, a time for the feed, and a source purge time. For example, the high frequency power is made higher, or the application time of high frequency power is made longer when forming a film with film quality of a low etching rate. In such a case, a $TiO_2$ film is formed which has a film thickness profile in which the film thickness is extremely thicker on the outer portion of the substrate than on the inner portion thereof, which causes poor in-plane film thickness uniformity although the desired film quality can be obtained. The outer portion of the substrate is an annular portion along the outer edge of the substrate, and the inner portion thereof is a portion including the center of the substrate and enclosed by the outer portion.

It is presumed that the film thickness on the outer portion of the substrate increases due to plasma spreading to the periphery of the outer portion of the substrate and due to the field intensity of the plasma increasing in the periphery of the outer portion when strong high frequency power is applied.

In order to adjust the film thickness distribution in the plane of the substrate while achieving the desired film quality, there can be needed complicated adjustment of film formation conditions such as the amount of feed of material gas, the flow rate of reactant gas, the flow rate of carrier gas, a pressure in the chamber in film formation, the distance between electrodes, and the temperature of the substrate. For example, the film thickness in the plane of the substrate is intended to be uniform. Change to dedicated hardware used under the conditions for strong high frequency power is considered when it is unable to adjust the film thickness distribution while achieving the desired film quality under adjustment of the film formation conditions. The change to such hardware increases costs.

SUMMARY

Some examples described herein may address the above-described problems. Some examples described herein may provide a plasma film forming method capable of easily adjusting a film thickness distribution in the plane of a substrate.

In some examples, a plasma film forming method includes repeating feeding material gas onto a substrate placed on a susceptor via a shower head provided to oppose the susceptor, performing plasma film formation on the substrate by applying high frequency power to the shower head while providing reactant gas onto the substrate, and performing post-purge of discharging the gas used in the plasma film formation while heating the shower head, for a time longer than 0.1 seconds, a plurality of times in this order.

BRIEF DESCRIPTION OF THE DRAWINGS

FIG. 46 illustrate distributions of F-concentrations in the outer portion of the substrate.

DETAILED DESCRIPTION

Examples of a plasma film forming method are described with reference to the drawings. The same or corresponding components are given the same signs, and their duplicate description may be omitted.

Figure 1:
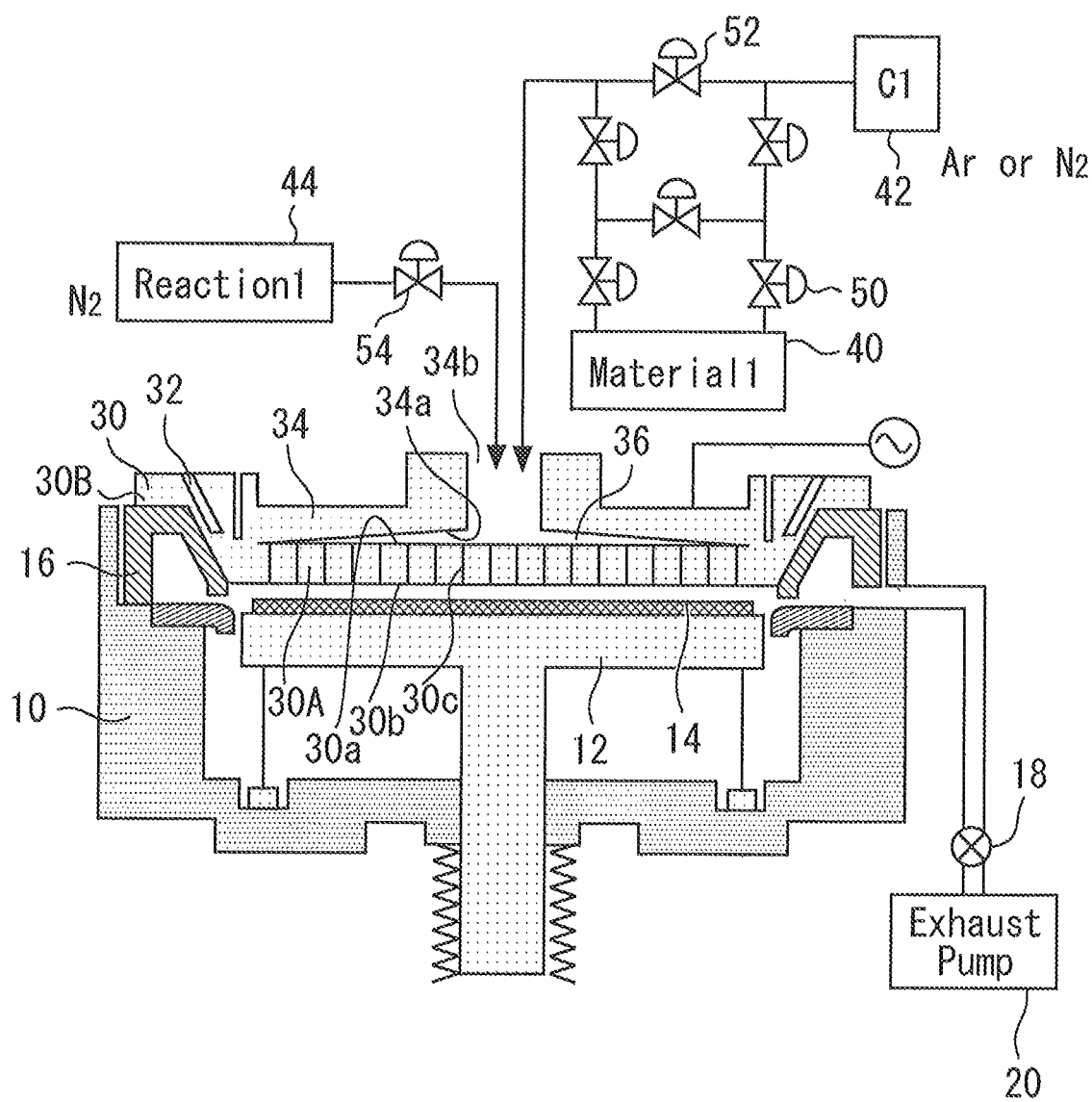
FIG. 1 is a diagram illustrating an exemplary configuration of a substrate processing apparatus.

FIG. 1 is a diagram illustrating an exemplary configuration of a substrate processing apparatus. A susceptor 12 is provided in a chamber 10. A substrate 14 which is a processing target can be placed on the susceptor 12. The substrate 14 is, for example, a Si wafer. The susceptor 12 and a shower head 30 provided thereabove form a structure including parallel plates. Such parallel plates of the susceptor 12 and the shower head 30 allow capacitively coupled plasma (CCP) to generate.

The shower head 30 includes a gas passing part 30A provided to oppose the susceptor 12, and an enclosing part 30B enclosing the gas passing part 30A. The gas passing part 30A has an upper face 30a and a lower face 30b. A plurality of through holes 30c are formed in the gas passing part 30A so as to allow gas to move from the upper face 30a side to the lower face 30b side. Various kinds of gas are provided onto the substrate 14 through the through holes 30c.

The enclosing part 30B can be provided to be annular in plan view. A heater 32 is provided in the enclosing part 30B to heat the shower head. The heater 32 is a sheath heater by way of example. The heater 32 heats the enclosing part 30B, and thereby, the gas passing part 30A connected to the enclosing part 30B is also heated. The heater 32 heats the outer portion of the gas passing part 30A to have a higher temperature than the inner portion of the gas passing part 30A. The heater 32 makes the temperature of the outer portion of the gas passing part 30A higher than the temperature of the inner portion of the gas passing part 30A.

A gas channel 34 is provided on the shower head 30. In some examples, the shower head 30 and the gas channel 34 can be welded together. The gas channel 34 has an opposing face 34a opposing the gas passing part 30A. The opposing face 34a may be inclined with respect to the upper face 30a, or may be a face parallel to the upper face 30a. Positioning of the opposing face 34a above upper face 30a provides a space 36 between the opposing face 34a and the upper face 30a. A gas introducing port 34b is provided at the center of the gas channel 34. Gas is provided to the space 36 via the gas introducing port 34b.

A material gas source 40, a carrier gas source 42 and a reactant gas source 44 are prepared as gas sources. The material gas source 22 is, for example, liquid TDMAT. Vapor of the material gas source 22 is provided to the chamber 10 with carrier gas from the carrier gas source 42. The carrier gas is, for example, $N_2$ or Ar. The reactant gas source 44 is filled, for example, with $O_2$ gas. For example, gases for forming a film of $TiO_2$ through plasma film formation can be prepared.

Feed or no feed of the gases and flow rates of the gases from the material gas source 40, the carrier gas source 42 and the reactant gas source 44 are regulated by valves 50, 52 and 54, respectively. The gases provided into the chamber 10 are exhausted to the outside, for example, via a exhaust duct 16 provided between the chamber 10 and the shower head 30. For example, the pressure in the chamber 10 can be determined by adjusting the degree of opening of a valve 18 and exhaust performance of a pump 20, the valve 18 and the pump 20 attached on the exhaust duct 16.

Figures 2, 3:
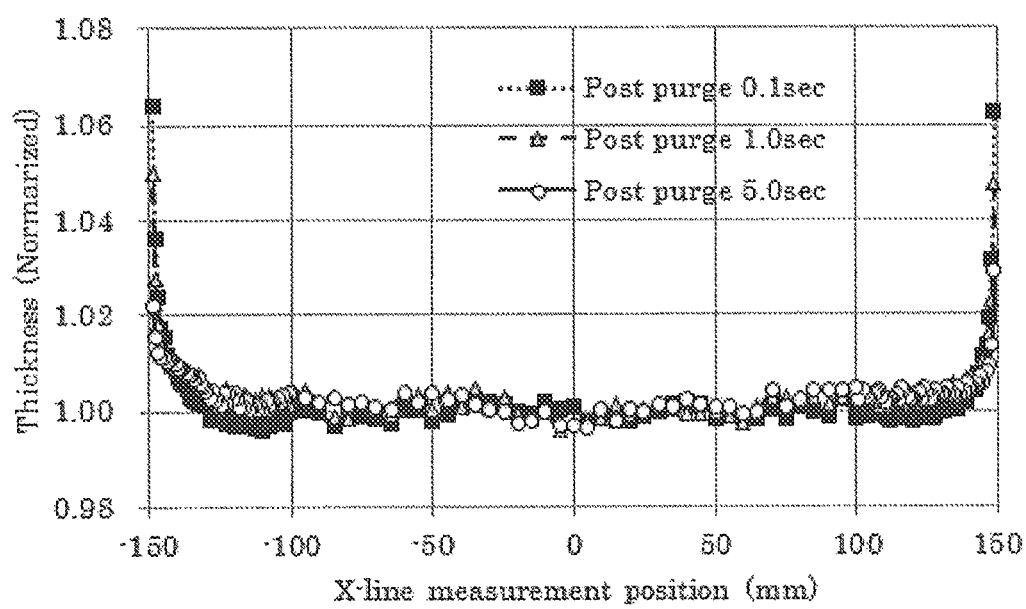
FIG. 2 is a diagram exemplarily illustrating a plasma film forming method.
FIG. 3 is a diagram illustrating the film thickness distribution.

FIG. 2 is a diagram exemplarily illustrating a plasma film forming method. Through this plasma film forming method, $TiO_2$ by way of example is formed on a substrate by a PE-ALD method. Specifically, feed, source purge, plasma film formation with RF, and post-purge are repeated a plurality of times in this order.

In the step of feed, the material gas is fed to the substrate 14 placed on the susceptor 12 via the shower head 30. Specifically, vapor of the material gas source 40 is provided into the chamber 10 using a gas flow of the carrier gas source 42. The material gas and the carrier gas are provided onto the substrate 14 via the gas introducing port 34b, the space 36 and the through holes 30c. Thereby, the material gas is caused to be adsorbed on the surface of the substrate 14.

The step of source purge is performed for discharging an excess film forming material after the adsorption of the film forming material on the surface of the substrate 14 is saturated. Accordingly, in the step of source purge, the material gas is not introduced into the chamber 10 but the carrier gas and the reactant gas are introduced into the chamber 10.

The step of RF is a step of applying high frequency power to the shower head 30 while providing the reactant gas onto the substrate 14 to perform plasma film formation on the substrate 14. The reactant gas is turned into radicals and reacts with the material adsorbed on the substrate 14, which leads to film formation on an atomic layer basis.

In the step of post-purge, the post-purge is performed for a time longer than 0.1 seconds to exhaust the gases used in the plasma film formation. An object of the post-purge is to exhaust radical reactant gas until the next step of feed from the step of RF which is the reaction step with plasma. If the process is put forward to the next step of feed without the exhaust of the radical reactant gas, the radical reactant gas remaining in the chamber 10 reacts with the material gas which is the film forming material, resulting in generation of particles on the surface of the substrate. Moreover, without the post-purge, the film formation occurs through chemical vapor deposition (PE-CVD), which disables film formation on an atomic layer basis to be achieved.

The series of processes as above are continued until a desired film thickness is obtained. In all the steps of feed, source purge, plasma film formation with RF, and post-purge, the reactant gas can be provided into the chamber 10 from the reactant gas source 44, and the carrier gas can be provided into the chamber 10 from the carrier gas source 42. In an example, the shower head 30 is heated by the heater 32 over the whole period of the ALD cycle. The extent of heating can be changed, heating can be performed at fixed temperature during a period of one ALD cycle, or the power can be changed over the time.

In the step of feed, the material gas such, for example, as TDMAT is adsorbed not only on the surface of the substrate 14 but also on the gas passage. The material gas is also adsorbed, for example, on the opposing face 34*a* of the gas channel 34 and the upper face 30*a* of the shower head 30. The material gas adsorbed on the opposing face 34*a* and the upper face 30*a* remains even after source purge, and is also not affected by plasma in the step of RF. Accordingly, the material gas adsorbed on the opposing face 34*a* and the upper face 30*a* in the step of feed remains until the stage of post-purge.

In post-purge, the material gas absorbed on the opposing face 34*a* and the upper face 30*a* is decomposed by heat of the heater 32. In the case of using TDMAT as the material gas, the following decomposition can occur.

The substance generated through the decomposition is referred to as "adsorption inhibitor". The adsorption inhibitor can contain dimethylamine. Dimethylamine is generated, for example, through the decomposition reaction with heat not less than 150° C. The adsorption inhibitor generated on the opposing face 34*a* or the upper face 30*a* is provided onto the substrate 14 through the through holes 30*c*. The decomposition tends to proceed more on the outer portion of the opposing face 34*a* than on the inner portion thereof since the outer portion is closer to the heater 32 to be at a higher temperature. The decomposition tends to proceed more on the outer portion of the upper face 30*a* than on the inner portion thereof since the outer portion is at a higher temperature. Accordingly, the adsorption inhibitor is adsorbed more on the outer portion of the substrate 14 than on the inner portion thereof. The outer portion of the substrate 14 is a portion along the outer edge of the substrate 14. The inner portion of the substrate 14 is a portion including the center of the substrate 14 and enclosed by the outer portion. In the next step of feed, the material gas is hardly adsorbed on the outer portion of the substrate 14 since the adsorption inhibitor is absorbed more on the outer portion of the substrate 14 than of the inner portion thereof. Meanwhile, the material gas is easily absorbed more on the inner portion of the substrate 14 since the adsorption inhibitor is less thereon. The rate of film growth on the outer portion of the substrate 14 becomes lower as the amount of adsorption of the material gas on the outer portion of the substrate 14 is more reduced. Such localization of the adsorption inhibitor on the substrate 14 enables control of a film thickness distribution on the substrate 14.

The amount of providing the adsorption inhibitor onto the substrate 14 can be adjusted by adjusting a post-purge time. As the post-purge time is made longer, the amount of decomposition of the material gas adsorbed on the opposing face 34*a* and the upper face 30*a* can be more increased.

Figure 4:
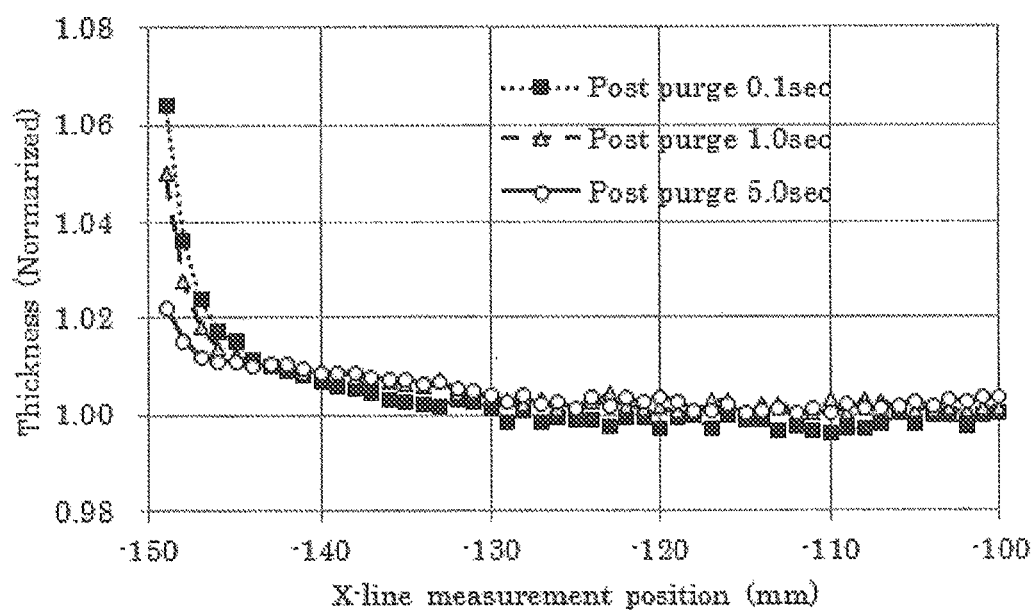
FIG. 4 is a partially expanded view of FIG. 3.

FIGS. 3 to 10 illustrate effects of a source purge time and the post-purge time on uniformity of the film thickness in the plane of the substrate. These experimental results were obtained using the film forming apparatus in which the shower head 30 and the gas channel 34 illustrated in FIG. 1 were welded together. FIG. 3 is a diagram illustrating relation between the post-purge time and the film thickness distribution in the plane of the substrate. The horizontal axis denotes the position from the center of a 300 mm substrate. The positions of −150 mm and 150 mm are at the ends of the substrate. FIG. 4 is a partially expanded view of FIG. 3. It is found from FIGS. 3 and 4 that the in-plane uniformity of the film thickness can be more enhanced at 1 second of post-purge time than at 0.1 seconds of the time, and that the in-plane uniformity of the film thickness can be more enhanced at 5 seconds of post-purge time than at 1 second of the time. Although the post-purge time is often set to be not more than 0.1 seconds with productivity taken into consideration, the in-plane uniformity of the film thickness can be enhanced when it is set to be longer than 0.1 seconds. The in-plane uniformity of the film thickness can be further enhanced when the post-purge time is set to be not less than 5 seconds.

Figure 5:
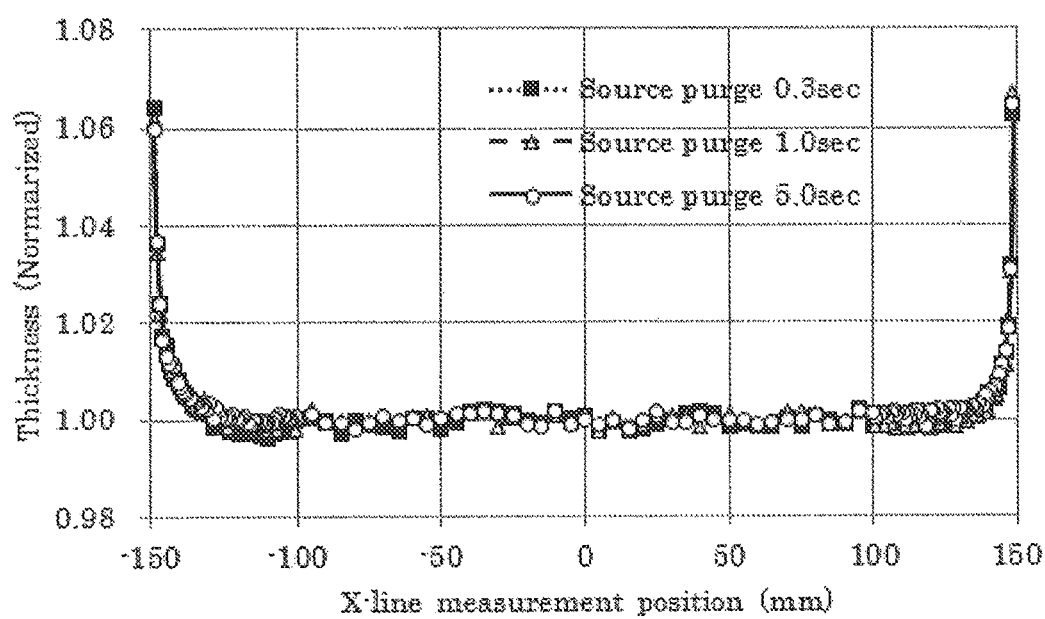
FIG. 5 is a diagram illustrating the film thickness distribution.
Figure 6:
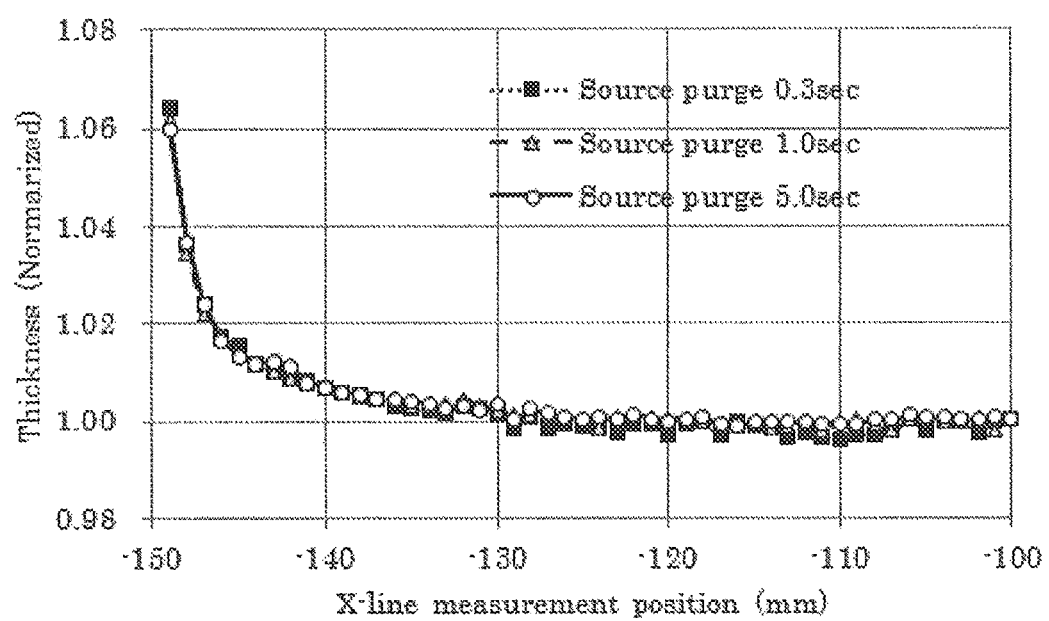
FIG. 6 is a partially expanded view of FIG. 5.

FIG. 5 is a diagram illustrating relation between the source purge time and the film thickness distribution in the plane of the substrate. FIG. 6 is a partially expanded view of FIG. 5. There is no significant difference between film thickness distributions obtained at 0.3 seconds, 1 second, and 5 seconds of source purge time. Therefore, adjustment of the source purge time does not improve or adjust the film thickness distribution.

Figure 7:
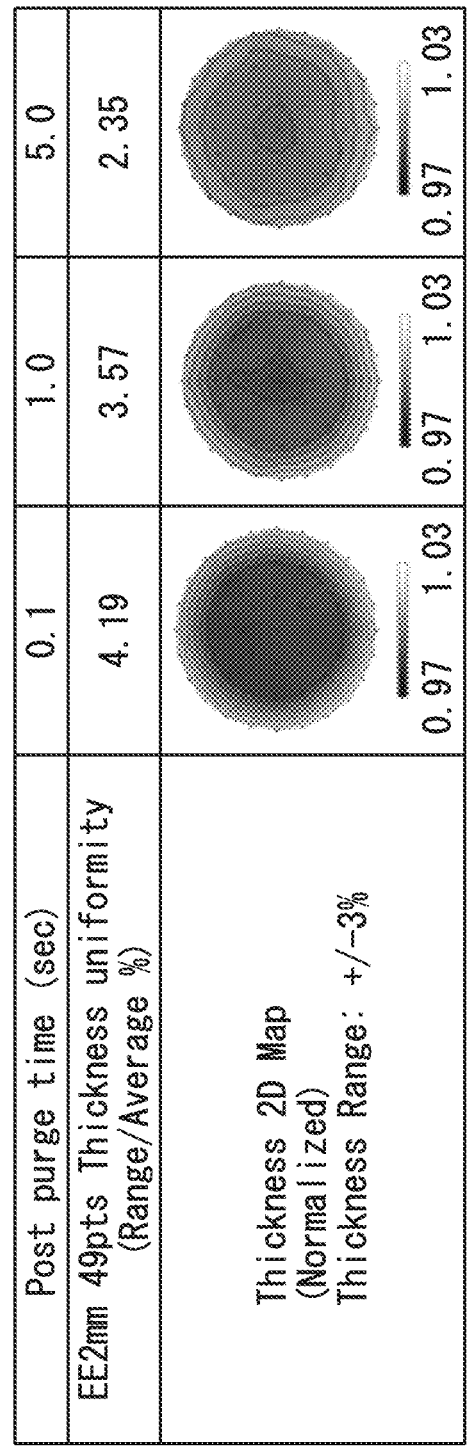
FIG. 7 is a map illustrating the in-plane film thickness distribution.
Figure 8:
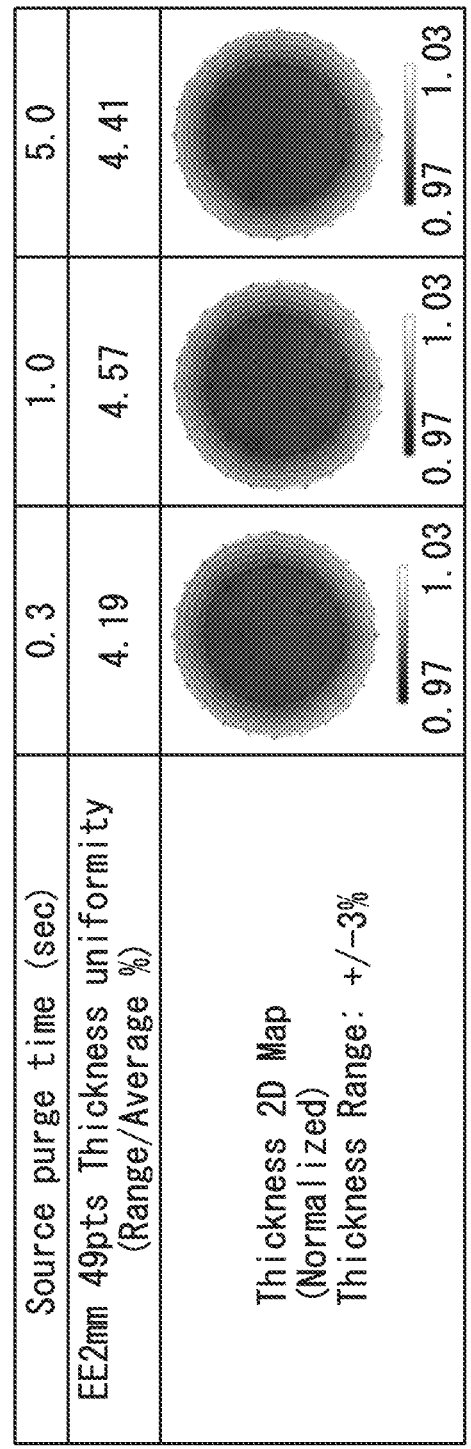
FIG. 8 is a map illustrating the in-plane film thickness distribution.

FIG. 7 is a map illustrating relation between the post-purge time and the in-plane film thickness distribution. FIG. 8 is a map illustrating relation between the source purge time and the in-plane film thickness distribution. It is found from FIGS. 7 and 8 that increase of the post-purge time contributes to improvement or adjustment of the in-plane film thickness distribution, but that increase of the source purge time does not improve or adjust the in-plane film thickness distribution.

Figure 9:
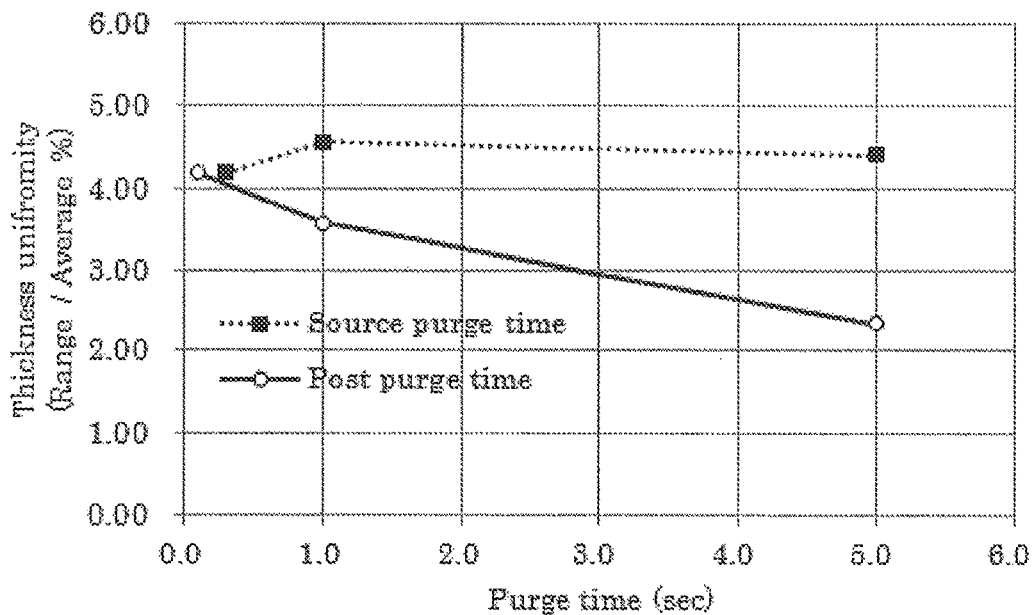
FIG. 9 is a reconstruction of the results in FIGS. 3 to 6 in view of the film thickness uniformity.
Figure 10:
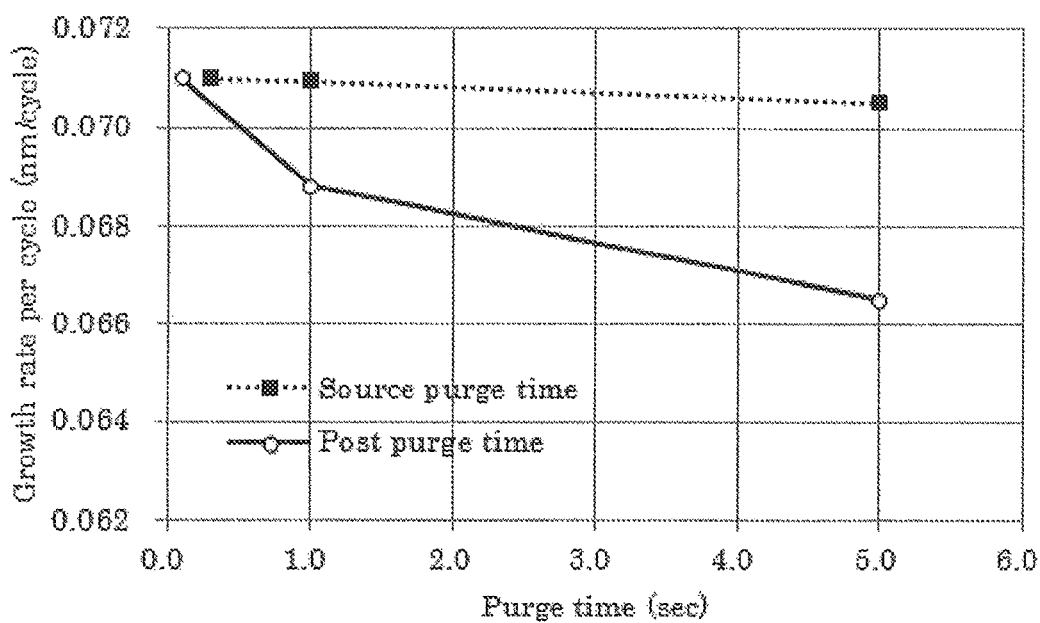
FIG. 10 is a reconstruction of the results in FIGS. 3 to 6 in view of the rate of film formation.

FIG. 9 is a reconstruction of the results in FIGS. 3 to 6 in view of the film thickness uniformity. FIG. 10 is a reconstruction of the results in FIGS. 3 to 6 in view of the rate of film formation. It is found also from these results that a longer post-purge time reduces the film forming rate and enhances the film thickness uniformity.

Figure 11:
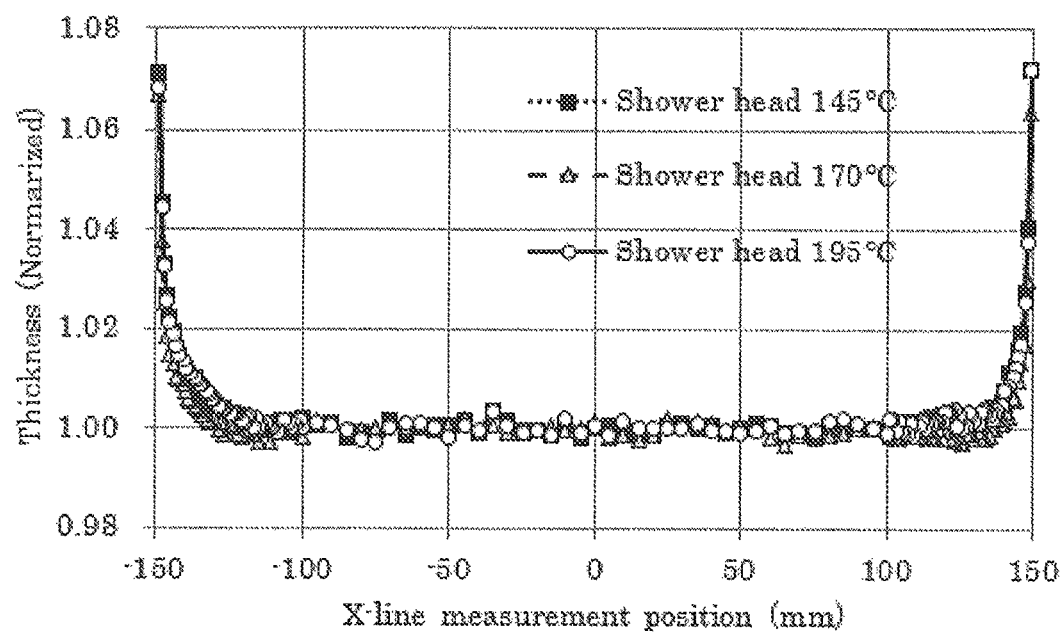
FIG. 11 illustrates results of measurements of the film thickness.
Figure 12:
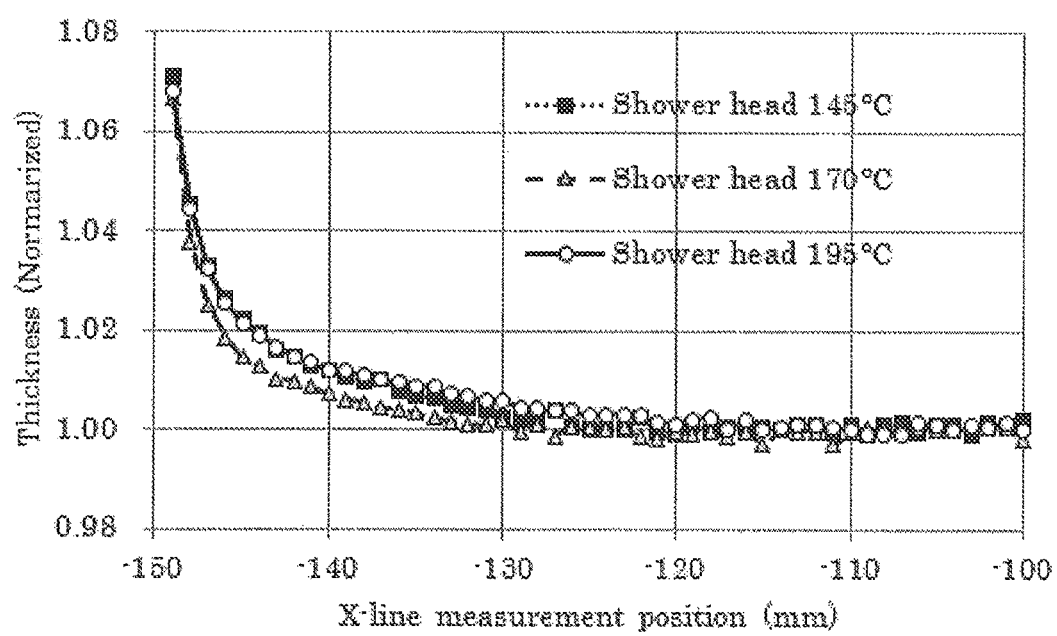
FIG. 12 is a partially expanded view of FIG. 11.

FIGS. 11 to 18 are diagrams illustrating relations between controlled temperatures of the shower head 30 and in-plane uniformities of the film formed on the substrate 14. FIG. 11 illustrates results of measurements of the film thickness from one end of the substrate 14 to the other end thereof while changing the controlled temperature of the shower head 30 at 145° C., 170° C. and 195° C. at 0.1 seconds of post-purge time. FIG. 12 is a partially expanded view of FIG. 11. When the post-purge time is 0.1 seconds, the change of the controlled temperature of the shower head 30 cannot cause a significant difference in film thickness distribution since the adsorption inhibitor generated is little.

Figure 13:
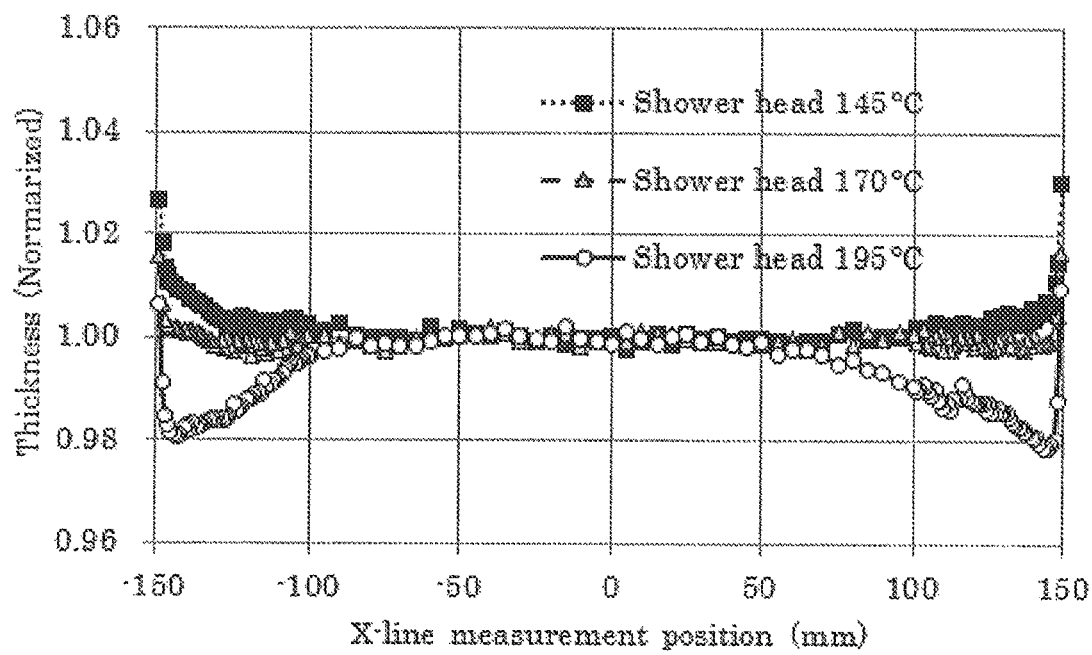
FIG. 13 illustrates results of measurements of the film thickness.
Figure 14:
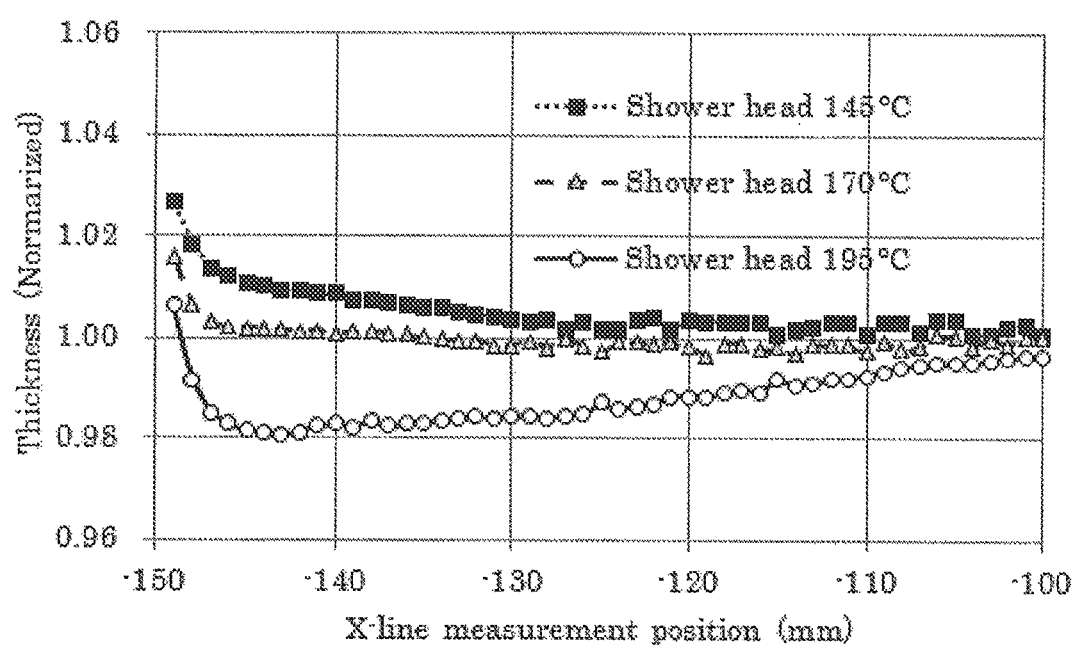
FIG. 14 is a partially expanded view of FIG. 13.

FIG. 13 illustrates results of measurements of the film thickness from one end of the substrate 14 to the other end thereof while changing the controlled temperature of the shower head 30 at 145° C., 170° C. and 195° C. at 5 seconds of post-purge time. FIG. 14 is a partially expanded view of FIG. 13. It is found from FIGS. 13 and 14 that at least a certain amount of adsorption inhibitor can be generated when the post-purge time is set to be 5 seconds. Besides, the amount of the adsorption inhibitor provided to the outer portion of the substrate 14 can be changed depending on the controlled temperature of the shower head 30. Namely, as the controlled temperature of the shower head 30 becomes higher, more adsorption inhibitor can be provided to the outer portion of the substrate 14 to suppress film formation on the outer portion.

Figure 15:
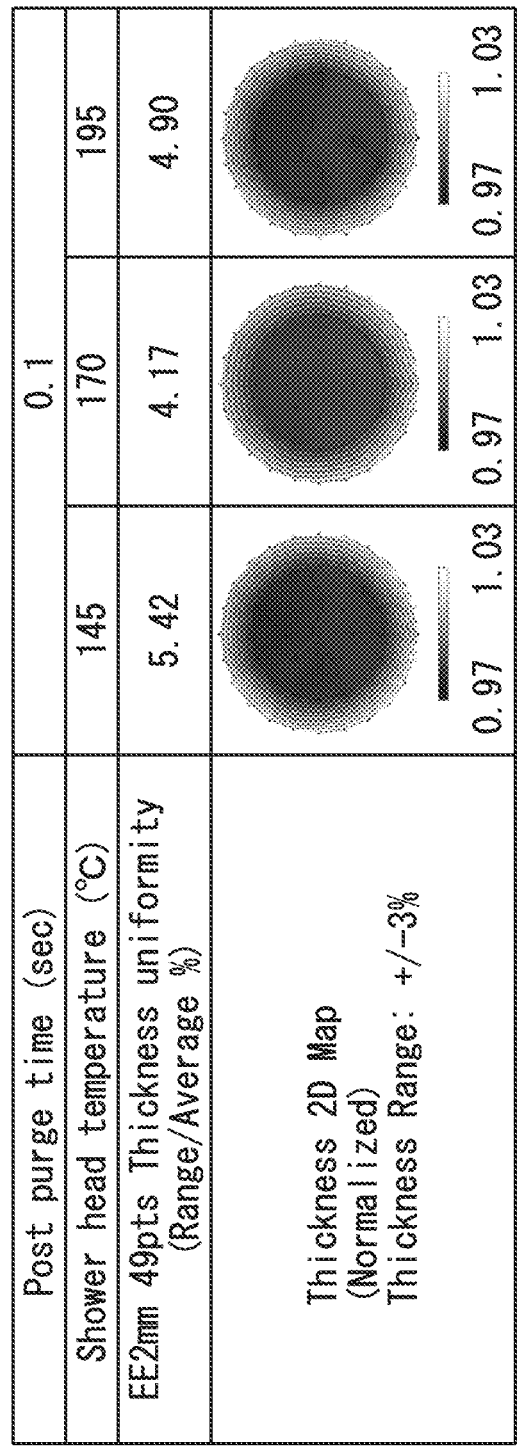
FIG. 15 is a map illustrating film thickness distributions in film formation.
Figure 16:
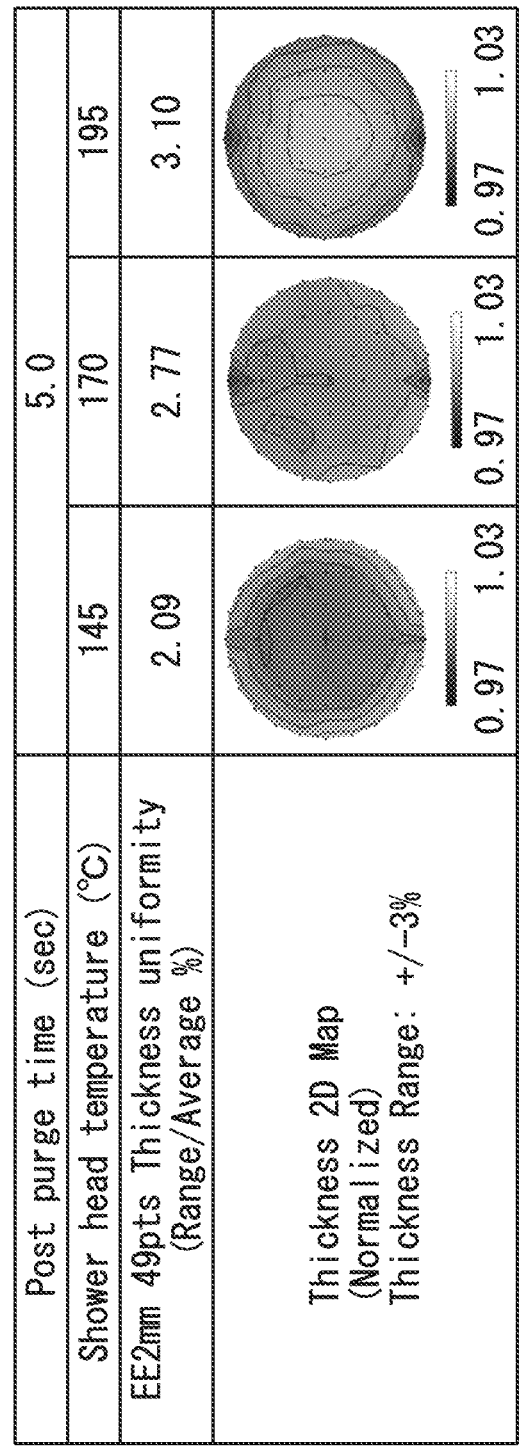
FIG. 16 is a map illustrating film thickness distributions in film formation.
Figure 17:
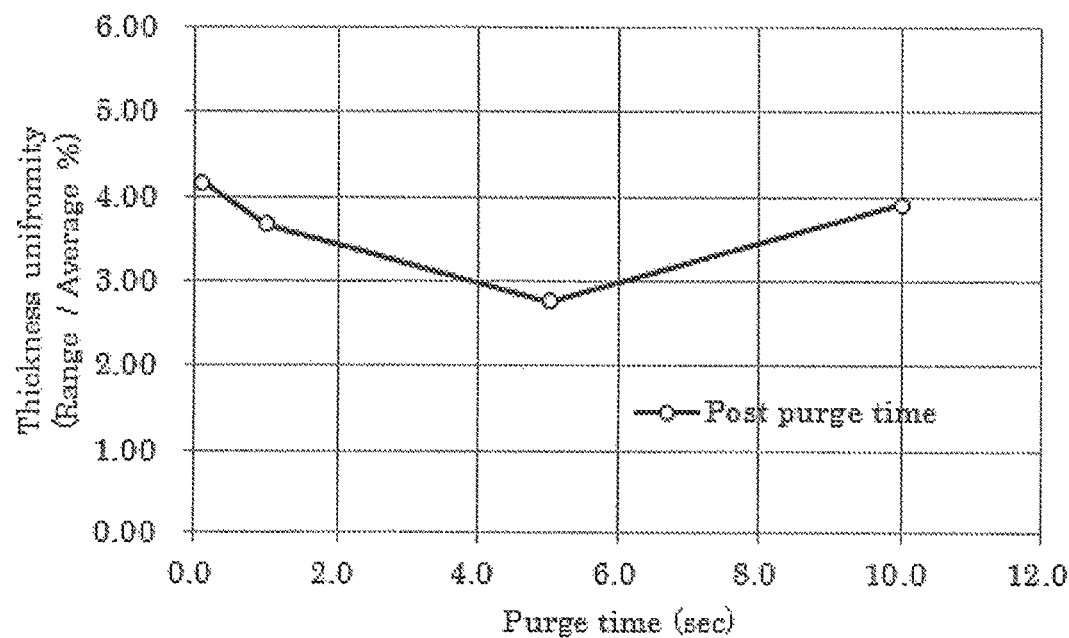
FIG. 17 is a diagram illustrating the film thickness uniformity.
Figure 18:
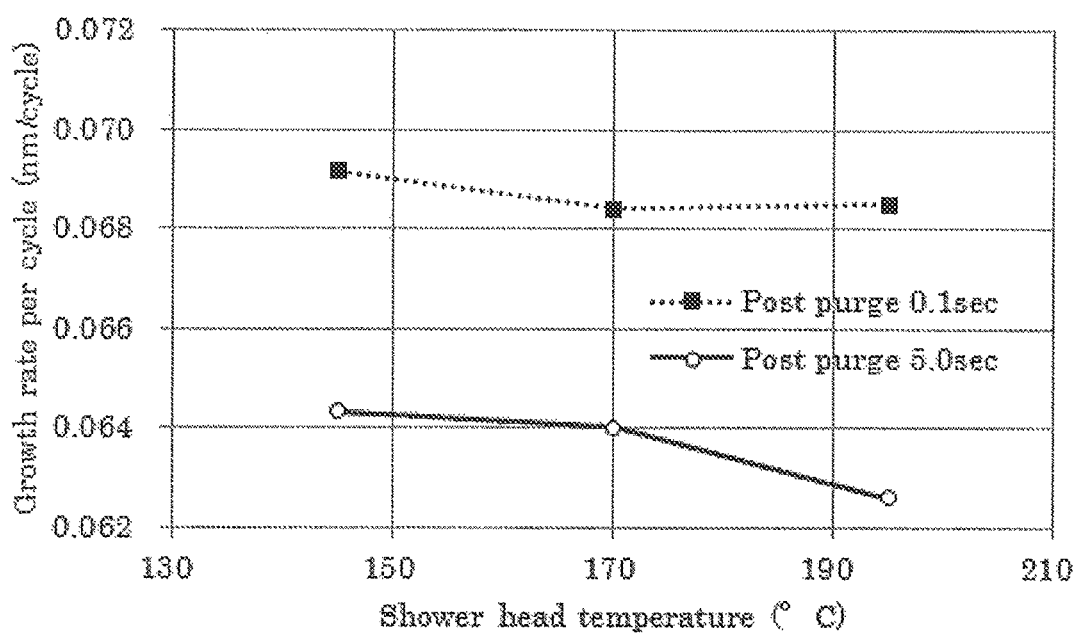
FIG. 18 is a reconstruction of the results in FIGS. 11 to 14 in view of the film forming rate.

FIG. 15 is a map illustrating film thickness distributions in film formation while changing the controlled temperature of the shower head 30 at 0.1 seconds of post-purge time. FIG. 16 is a map illustrating film thickness distributions in film formation while changing the controlled temperature of the shower head 30 at 5 seconds of post-purge time. FIG. 17 is a diagram illustrating relation between the post-purge time and the film thickness uniformity. When the post-purge time is increased from 0.1 seconds to 5 seconds, the film thickness uniformity is improving due to suppression of film formation on the outer portion of the substrate 14. Nevertheless, when the post-purge time is increased from 5 seconds to 10 seconds, the film thickness uniformity is deteriorating due to excess suppression of film formation on the outer portion of the substrate 14. FIG. 18 is a reconstruction of the results in FIGS. 11 to 14 in view of the film forming rate.

In some examples, high film thickness uniformity in the plane of a substrate may be required. In another example, a thicker outer portion of the substrate than the inner portion may be required. In still another example, a thinner outer portion of the substrate than the inner portion may be required. Depending on the process, various film thickness profile is requested. Since the aforementioned examples and the following examples achieve high controllability of the in-plane film thickness distribution, they can satisfy those requests.

With the examples in FIGS. 11 to 18, 0.1 seconds of post-purge time and 5 seconds of post-purge time are compared with each other. Nevertheless, according to another example, the amount of the adsorption inhibitor provided onto the substrate can be changed in accordance with the controlled temperature of the shower head 30 even at 1 second of post-purge time. Accordingly, there can be shortened the post-purge time for obtaining a desired film thickness profile by raising the temperature of the shower head 30.

Figure 19:
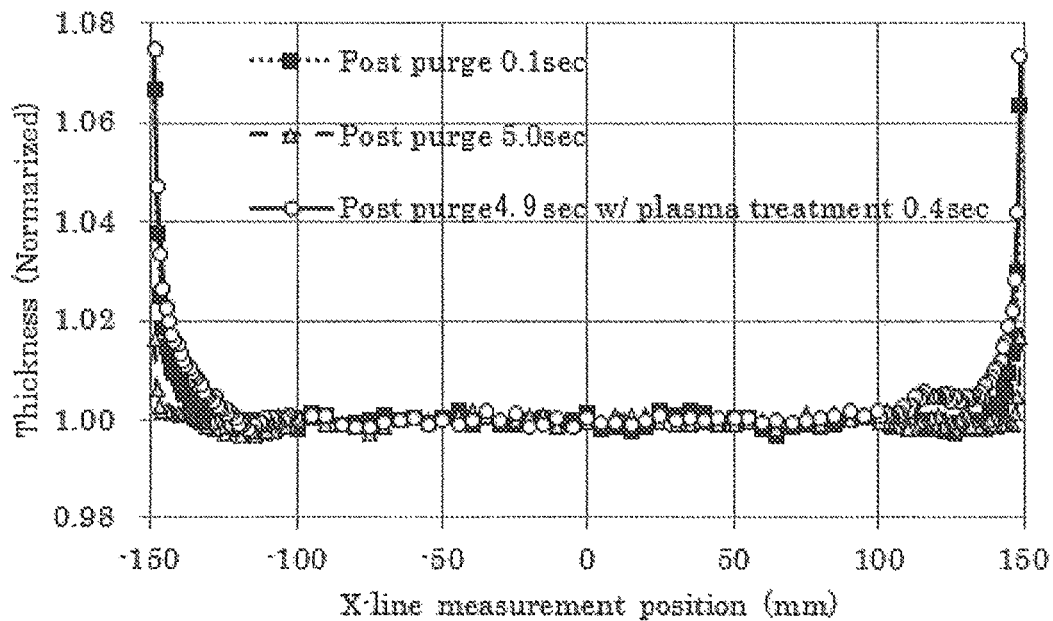
FIG. 19 illustrates film thickness distributions on the substrate.
Figure 20:
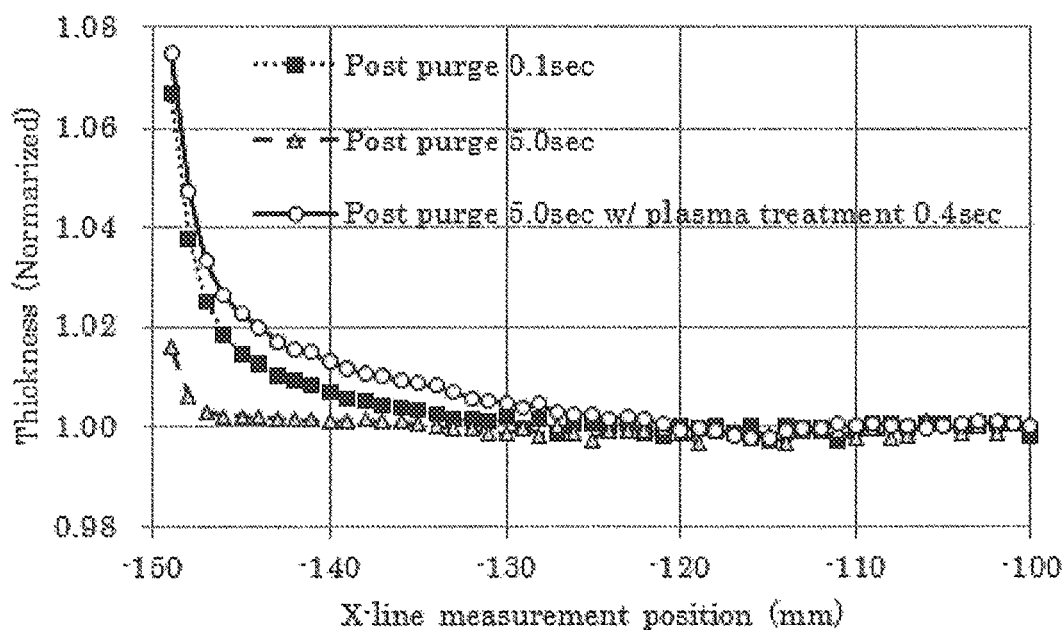
FIG. 20 is a partially expanded view of FIG. 19.

FIGS. 19 to 23 are diagrams illustrating that the adsorption inhibitor obtained through decomposition by post-purge suppresses the film thickness on the substrate. FIG. 19 illustrates film thickness distributions on the substrate 14 in the cases of 0.1 seconds and 5 seconds of post-purge time. FIG. 19 also illustrates a film thickness distribution in film formation of an ALD process one cycle of which is completed by performing post-purge for 4.9 seconds, then, performing plasma treatment of applying 200 W of high frequency power for 0.4 seconds, and after that, performing post-purge for 0.1 seconds. FIG. 20 is a partially expanded view of FIG. 19. The additional plasma treatment for 0.4 seconds decomposes and removes the adsorption inhibitor provided onto the substrate 14 through the post-purge for 4.9 seconds, to be exhausted. The process proceeds to the next feed without the adsorption inhibitor sufficiently provided onto the substrate 14. Accordingly, when the additional plasma treatment for 0.4 seconds is performed, the film thickness distribution on the substrate 14 is not uniform.

Figure 21:
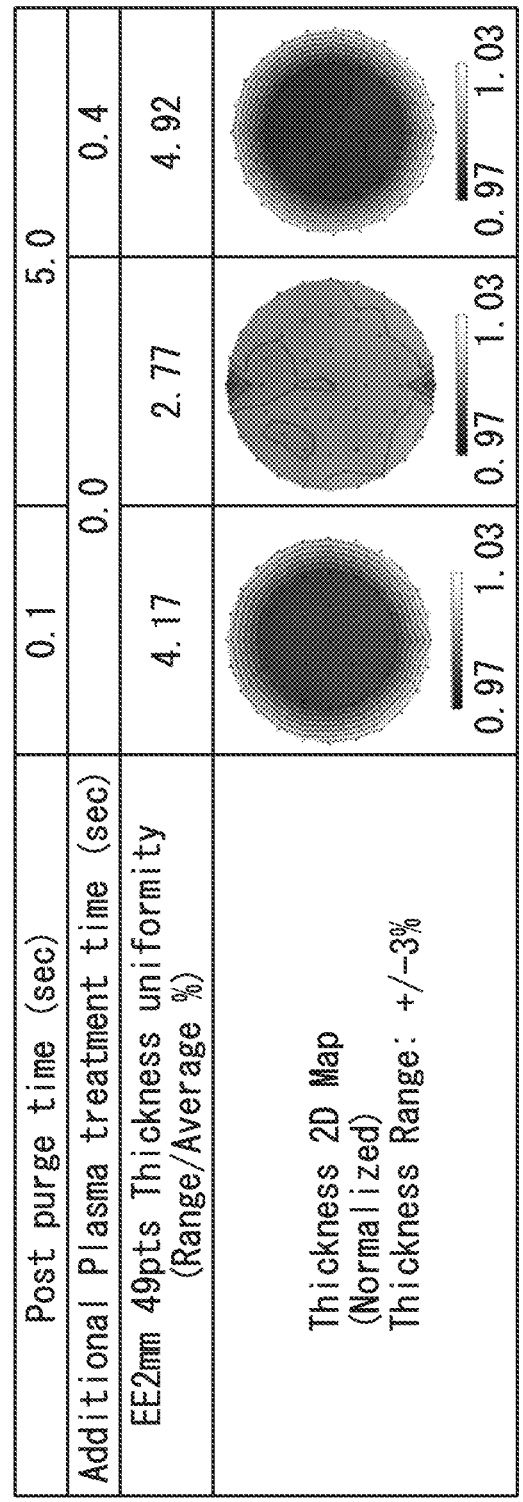
FIG. 21 is a map illustrating film thickness distributions of film formation.
Figure 22:
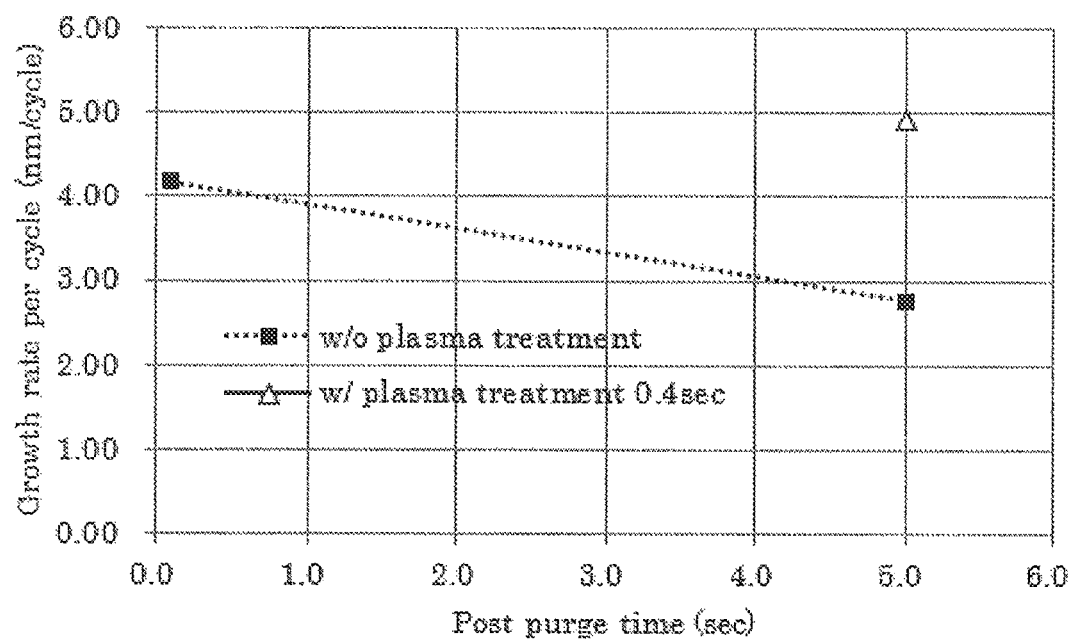
FIG. 22 is a reconstruction of the experimental results in FIGS. 19 and 20 in view of the film forming rate.
Figure 23:
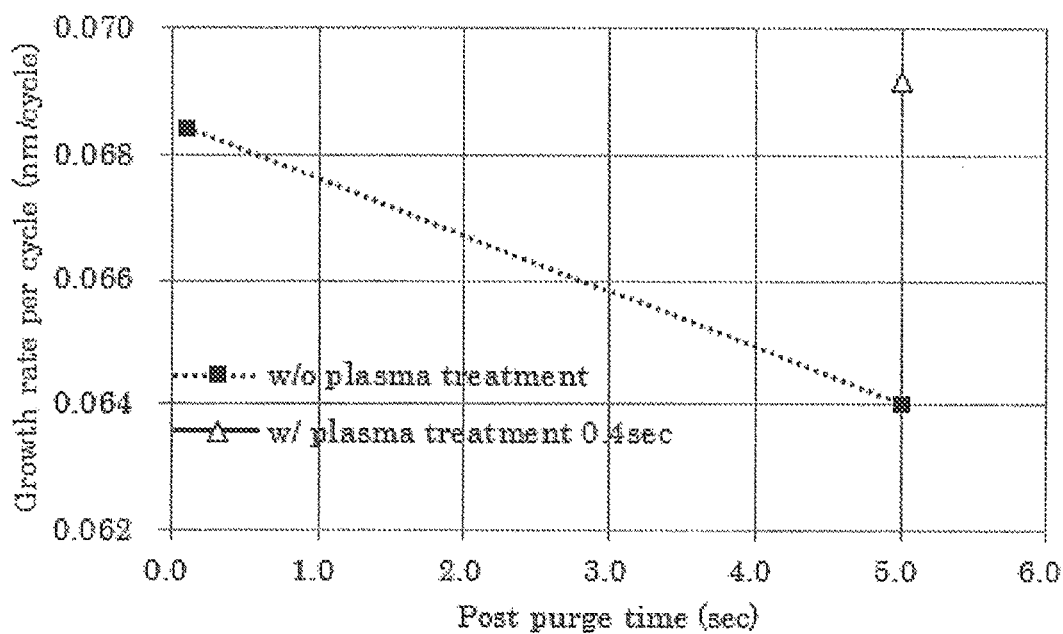
FIG. 23 is a reconstruction of the experimental results in FIGS. 19 and 20 in view of the film forming rate.

FIG. 21 is a map illustrating film thickness distributions of film formation under the three conditions in FIGS. 19 and 20. FIGS. 22 and 23 are reconstructions of the experimental results in FIGS. 19 and 20 in view of the film forming rate. The experimental results in FIGS. 19 to 23 indicate that the aforementioned adsorption inhibitor controls the film thickness profile in the plane of the substrate 14.

In the aforementioned examples, the material gas is TDMAT, the reactant gas is $O_2$ gas, and a film of $TiO_2$ is formed through plasma film formation. Nevertheless, these gases can be replaced by other gases. The adsorption inhibitor can be an amine-based material, a fluorine-based material or a halogen-based material. For example, the adsorption inhibitor can be an amine-based material such as dimethylamine, methylamine, triethylamine, ethylamine, triethylamine or diethylamine, fluorine-based gas such as $F_2$, $NF_3$, $ClF_3$, $C_2F_6$, $C_3F$, $C_4F_8$, HF or $COF_2$, or other halogen-based gas.

In post-purge, the material gas adsorbed on the gas channel 34 or the shower head is decomposed, thereby, the adsorption inhibitor is provided onto the substrate 14, and the adsorption inhibitor is localized on the substrate 14. In the post-purge, the adsorption inhibitor can be provided onto the substrate 14 by decomposing the material gas adsorbed on the upper face 30a or the opposing face 34a. How the adsorption inhibitor is distributed on the substrate 14 can determine the distribution and uniformity of the film thickness. The distribution of the adsorption inhibitor can be adjusted by adjusting the post-purge time and adjusting the temperature of the shower head 30. The configuration for generating the adsorption inhibitor can be arbitrarily changed. The portion where the adsorption inhibitor is generated can be a portion which is heated and does not undergo plasma treatment. The portion where the adsorption inhibitor is generated is exemplarily the shower head 30 and the gas channel 34.

Figure 24:
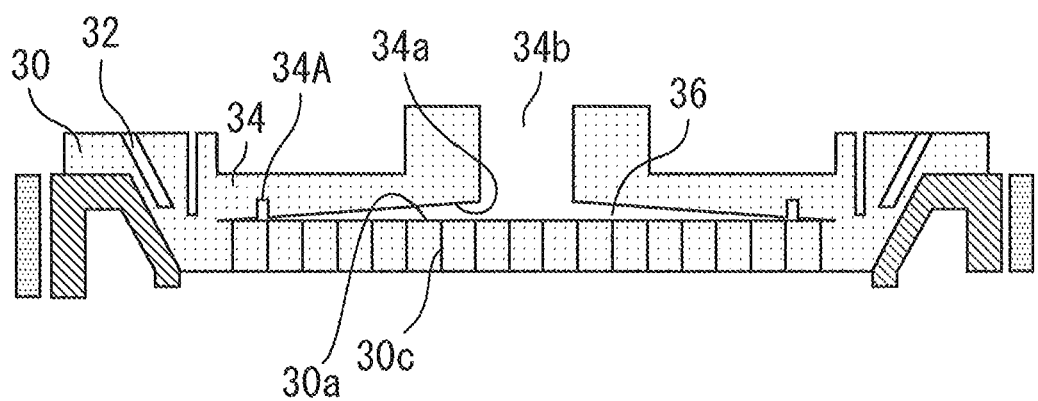
FIG. 24 is a cross-sectional view of the shower head and the gas channel used in a plasma film forming method according to another example.
Figure 25A:
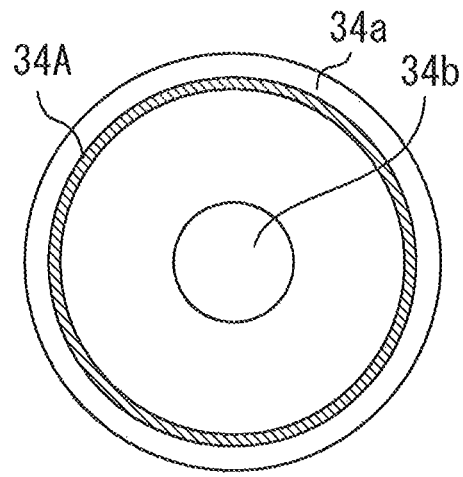
FIG. 25A shows an annular recess part formed on the opposing face.
Figure 25B:
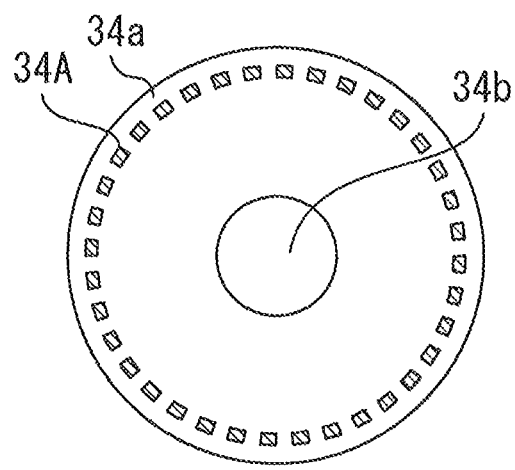
FIG. 25B shows a plurality of recess parts formed on the opposing face.
Figure 25C:
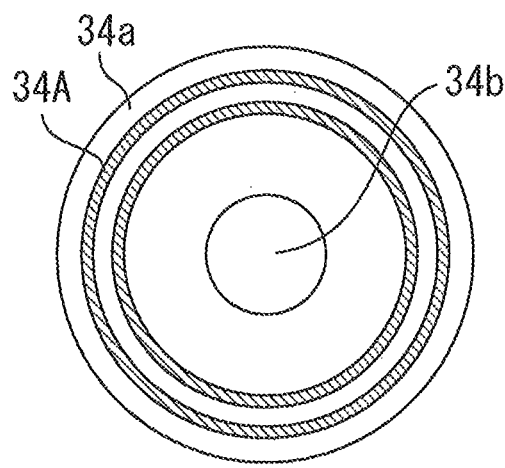
FIG. 25C shows annular recess parts concentrically formed on the opposing face.

FIG. 24 is a cross-sectional view of the shower head 30 and the gas channel 34 used in a plasma film forming method according to another example. A recess part 34A composed of a groove or a dimple is formed on the opposing face 34a of the gas channel 34. The recess part(s) 34A can be formed at any place on the opposing face 34a. FIGS. 25A, 25B and 25C illustrate examples of places where the recess part(s) 34A are formed. In the example of FIG. 25A, an annular recess part 34A is formed on the opposing face 34a in plan view. In the example of FIG. 25B, a plurality of recess parts 34A formed on the opposing face 34a constitute one ring as a whole in plan view. In the example of FIG. 25C, annular recess parts 34A are concentrically formed on the opposing face 34a in plan view. In another example, another shape of recess part(s) 34A can be formed.

More material gas is adsorbed on a portion having the recess part(s) 34A formed out of the opposing face 34a than on a portion without the recess part(s) 34A. Therefore, more adsorption inhibitor can be generated on the portion having the recess part(s) 34A formed than on the portion without the recess part(s) 34A. Accordingly, the recess part(s) 34A can be provided right above a portion where film formation is wanted to be suppressed on the substrate 14, and thereby, much adsorption inhibitor can be provided onto the relevant portion. The film thickness distribution in the plane of the substrate 14 can be adjusted by controlling the amount of adsorption of the material gas with the recess part(s) 34A, in addition to controlling the distribution of the amount of generation of the adsorption inhibitor by generating a temperature distribution on the shower head and the gas channel 34 with the heater 32.

Figure 26:
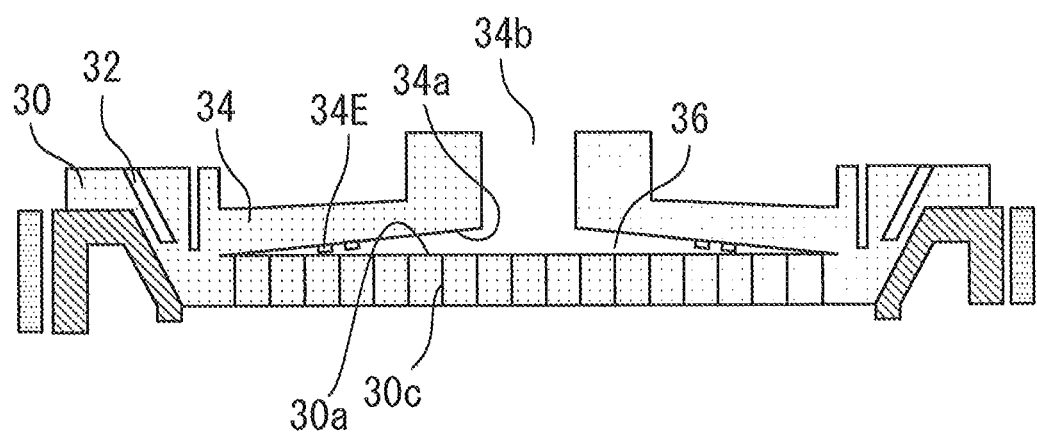
FIG. 26 is a cross-sectional view of the shower head and the gas channel used in a plasma film forming method according to another example.

FIG. 26 is a cross-sectional view of the shower head 30 and the gas channel 34 used in a plasma film forming method according to another example. An embossment 34E is formed on the opposing face 34a. The embossment 34E is a portion rising from the opposing face 34a. The embossment 34E can be provided at any place, for example, on the opposing face 34a. The portion having the embossment 34E formed has a larger surface area than a portion without the embossment 34E formed. Therefore, more material gas is adsorbed on the portion having the embossment 34E formed. Hence, more adsorption inhibitor can be generated on the portion having the embossment 34E formed than on the portion without the embossment 34E formed. This distribution of the amount of generation of the adsorption inhibitor is reflected on the substrate 14, which determines the film thickness distribution on the substrate 14.

Figure 27:
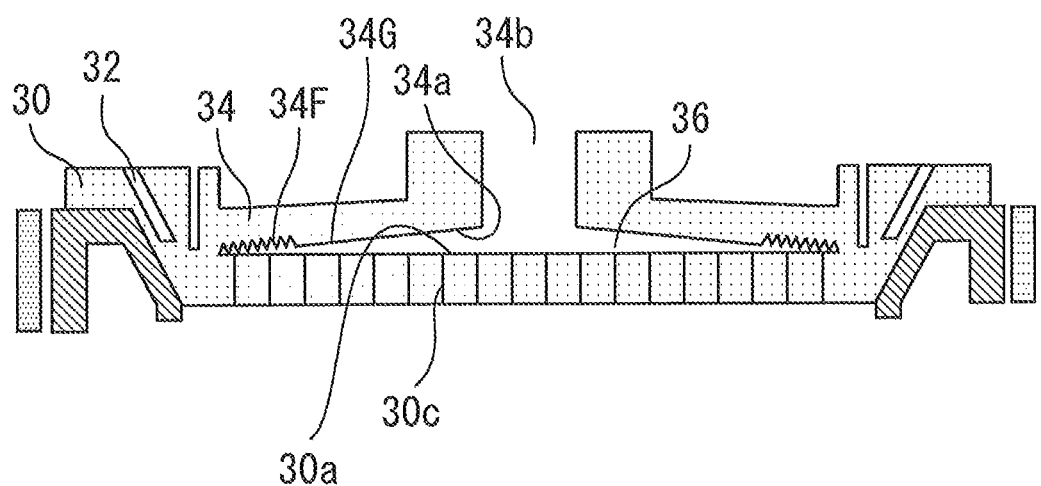
FIG. 27 is a cross-sectional view of the shower head and the gas channel used in a plasma film forming method according to another example.

FIG. 27 is a cross-sectional view of the shower head 30 and the gas channel 34 used in a plasma film forming method according to another example. The opposing face 34a has a first portion 34F and a second portion 34G. The first portion 34F has a larger surface roughness than the second portion 34G. While the surface roughness is exemplarily an arithmetic average roughness Ra, any other surface roughness may be used as a parameter. For example, surface blasting can be performed on the first portion 34F, and thereby, the first portion 34F can be processed to be rougher than the second portion 34G. In the step of feed, more material gas adheres on the first portion 34F larger in surface roughness than on the second portion 34G smaller in surface roughness.

Figure 28A:
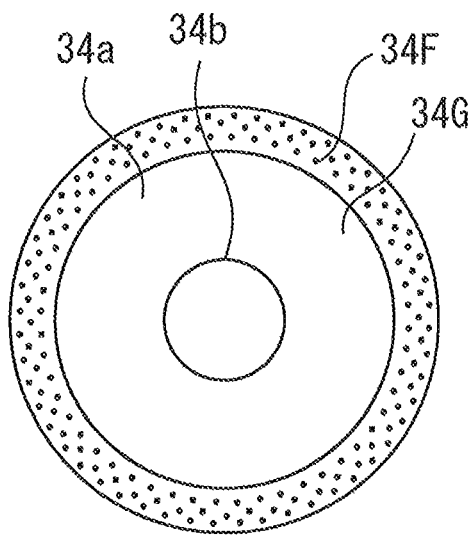
FIG. 28A shows the distributions of the first portion.
Figure 28B:
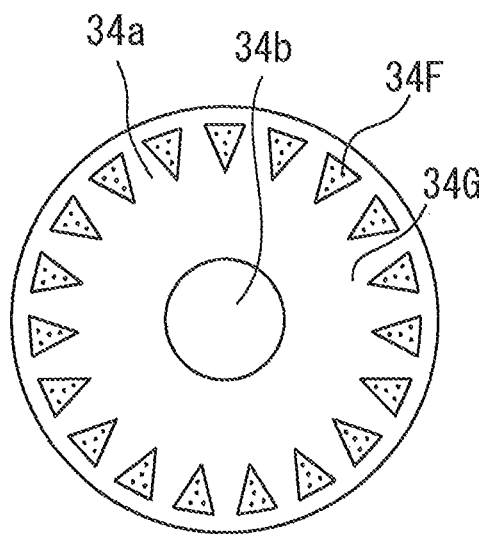
FIG. 28B shows the distributions of the first portion.

FIGS. 28A and 28B are diagrams exemplarily illustrating distributions of the first portion 34F. FIG. 28A illustrates formation of an annular first portion 34F on the outer portion of the opposing face 34a. FIG. 28B illustrates arrangement of a plurality of first portions 34F into one ring as a whole. In another example, another shape of first portion(s) 34F can be employed. Notably, for example, the aforementioned embossment can be formed into a pattern of FIG. 25A, 25B or 25C, or FIG. 28A or 28B.

Figure 29:
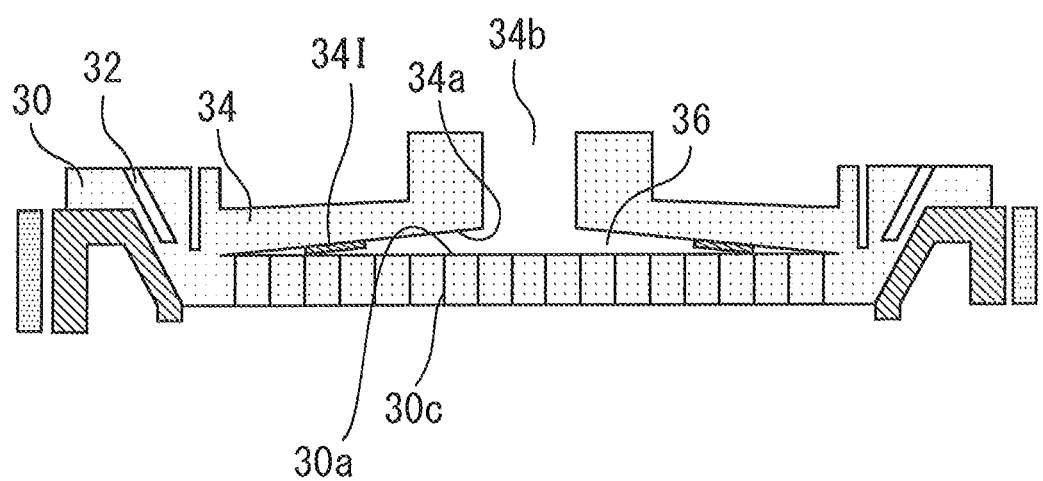
FIG. 29 is a cross-sectional view of the shower head and the gas channel used in a plasma film forming method according to another example.
Figure 30:
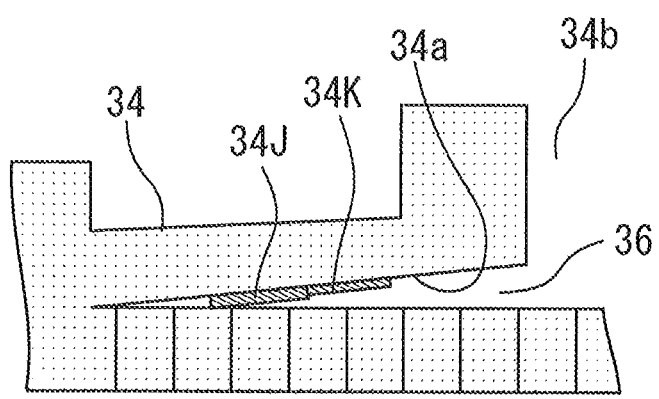
FIG. 30 is a cross-sectional view of the shower head and the gas channel used in a plasma film forming method according to another example.

FIG. 29 is a cross-sectional view of the shower head 30 and the gas channel 34 used in a plasma film forming method according to another example. A porous material 34I is formed on a part of the opposing face 34a. For example, the porous material 34I can be formed by alumite treatment. The porous material 34I can be provided at any place on the opposing face 34a. In the step of feed, much material gas is adsorbed in micropores of the porous material 34I. Accordingly, more adsorption inhibitor can be provided right below the porous material 34I than a portion without the porous material 34I. FIG. 30 is a cross-sectional view of the shower head 30 and the gas channel 34 used in a plasma film forming method according to another example. Porous materials 34J and 34K are formed on the opposing face 34a. Since the porous material 34J is thicker than the porous material 34K, more material gas can be adsorbed thereon. As above, adjustments of the position and the thickness of the porous material can adjust the distribution of the adsorption inhibitor provided onto the substrate 14.

The recess part(s) 34A, the embossment 34E, the rough first portion 34F, and the porous materials 34I, 34J and 34K mentioned above are an example of methods of increasing the surface area of the opposing face 34a. The surface area of the opposing face 34a can also be adjusted in other methods. The patterns of the recess part(s) 34A, the embossment 34E, the rough first portion 34F, and the porous materials 34I, 34J and 34K mentioned above are arbitrary and, for example, the patterns in FIGS. 25A, 25B, 25C, 28A and 28B can be employed. Moreover, the aforementioned methods of increasing the surface area can also be applied to the upper face 30a of the gas passing part 30A.

Figure 31:
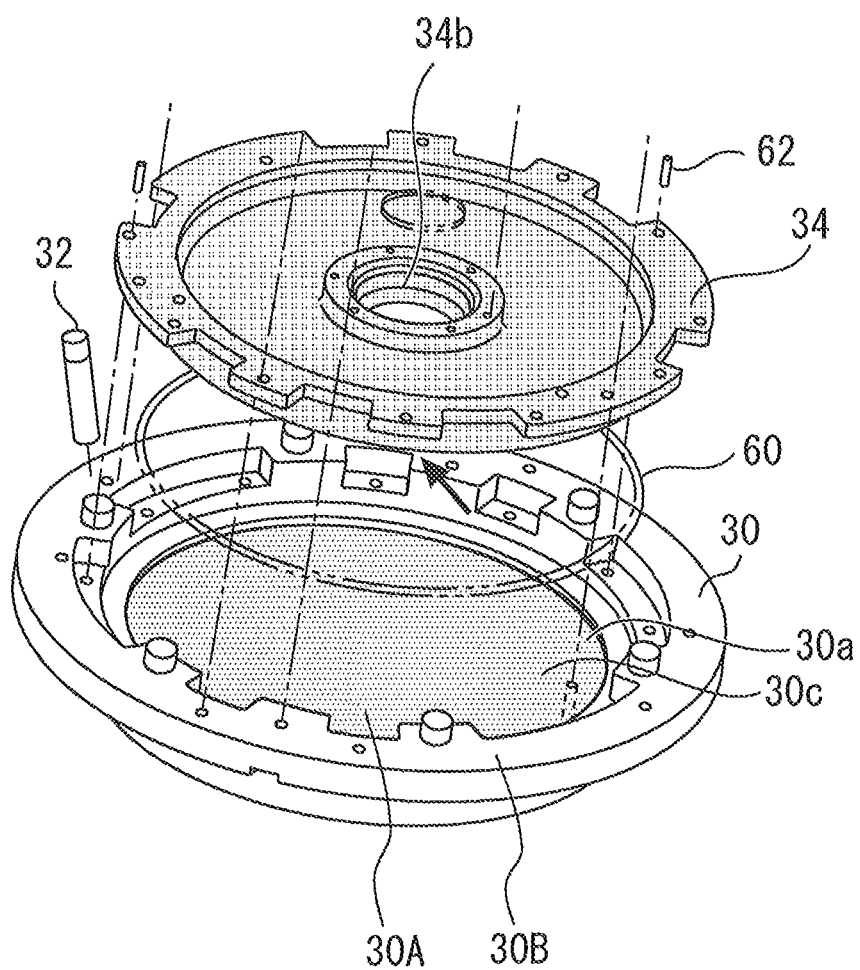
FIG. 31 is a perspective view of the shower head and the gas channel according to another example.

FIG. 31 is a perspective view of the shower head 30 and the gas channel 34 according to another example. In this example, an O-ring 60 is provided between the shower head 30 and the gas channel 34. The space 36 illustrated in FIG. 1 is sealed with the O-ring 60. FIG. 31 illustrates fixing of the gas channel 34 to the shower head 30 with screws 62.

Figure 32:
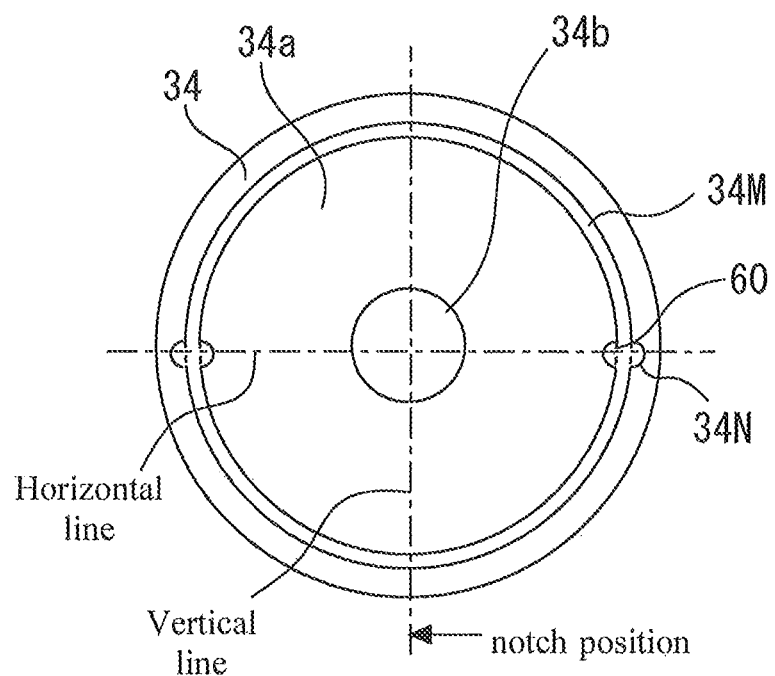
FIG. 32 is a diagram of the opposing face of the gas channel.

FIG. 32 is a diagram of the opposing face 34a of the gas channel 34. An annular groove 34M is formed on the opposing face 34a to at least partially accommodate the O-ring 60. The O-ring 60 is indicated by a broken line. Two O-ring grooves 34N are provided at two places on the annular groove 34M for facilitating detachment of the O-ring 60. The O-ring groove 34N is a recess wider than the annular groove 34M.

Figure 33:
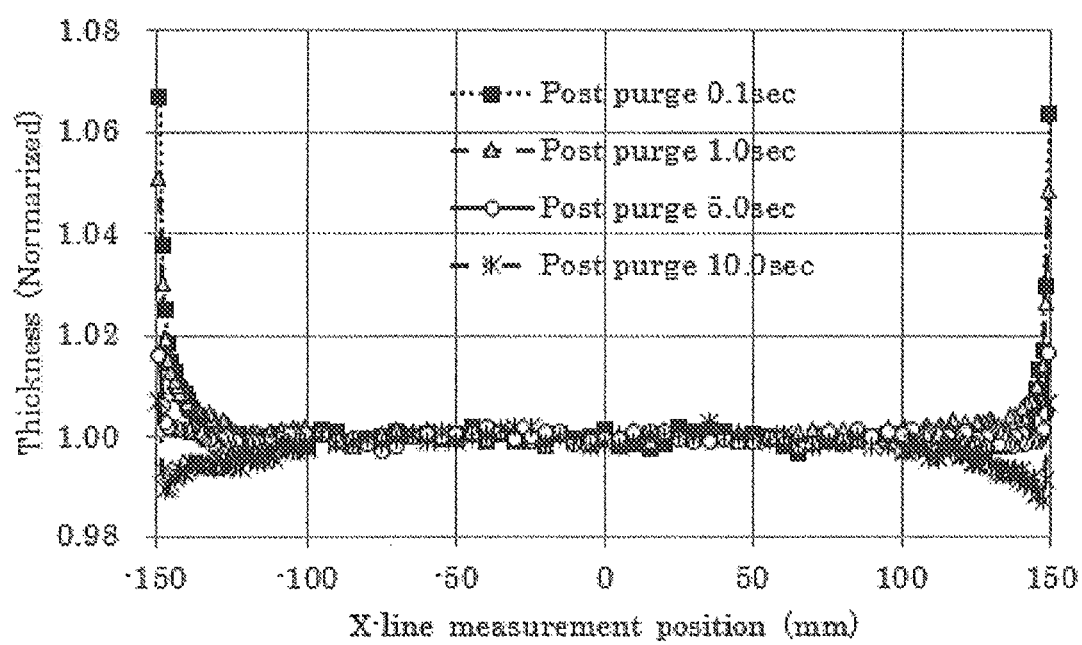
FIG. 33 illustrates the in-plane film thickness distribution.
Figure 34:
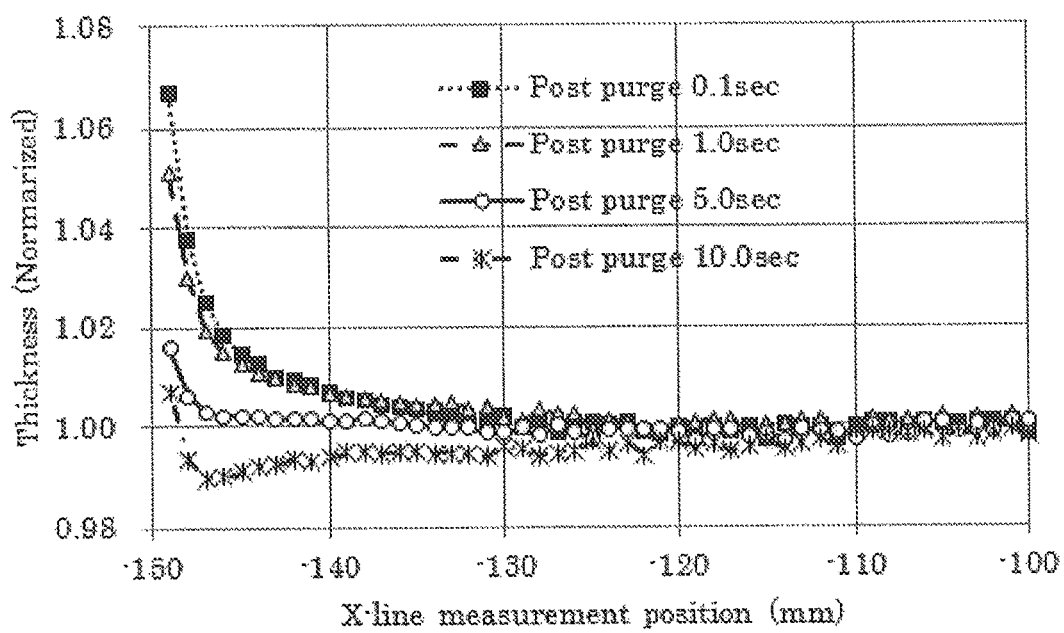
FIG. 34 is a partially expanded view of FIG. 33.

FIGS. 33 to 39 are diagrams of results of ALD film formation in a substrate processing apparatus in which the O-ring 60 is provided between the shower head 30 and the gas channel 34. FIG. 33 illustrates relation between the post-purge time and the in-plane film thickness distribution. FIG. 34 is a partially expanded view of FIG. 33. It is found from FIGS. 33 and 34 that the film thickness distribution can be controlled by adjusting the post-purge time.

Figure 35:
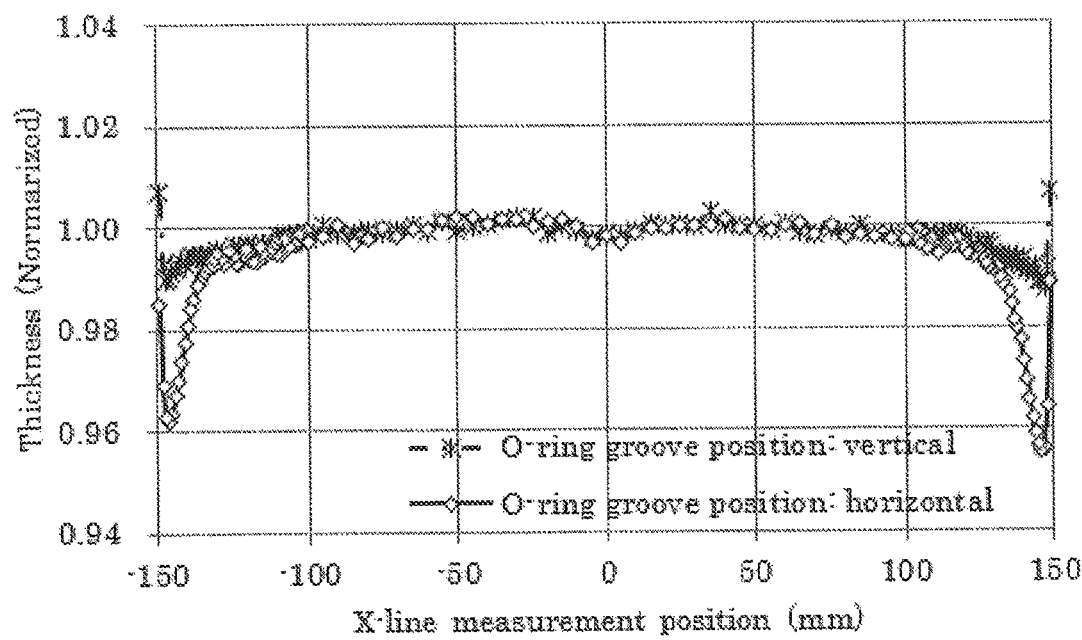
FIG. 35 is a diagram illustrating a film thickness distributions along the vertical line in FIG. 32 and the horizontal line in FIG. 32.
Figure 36:
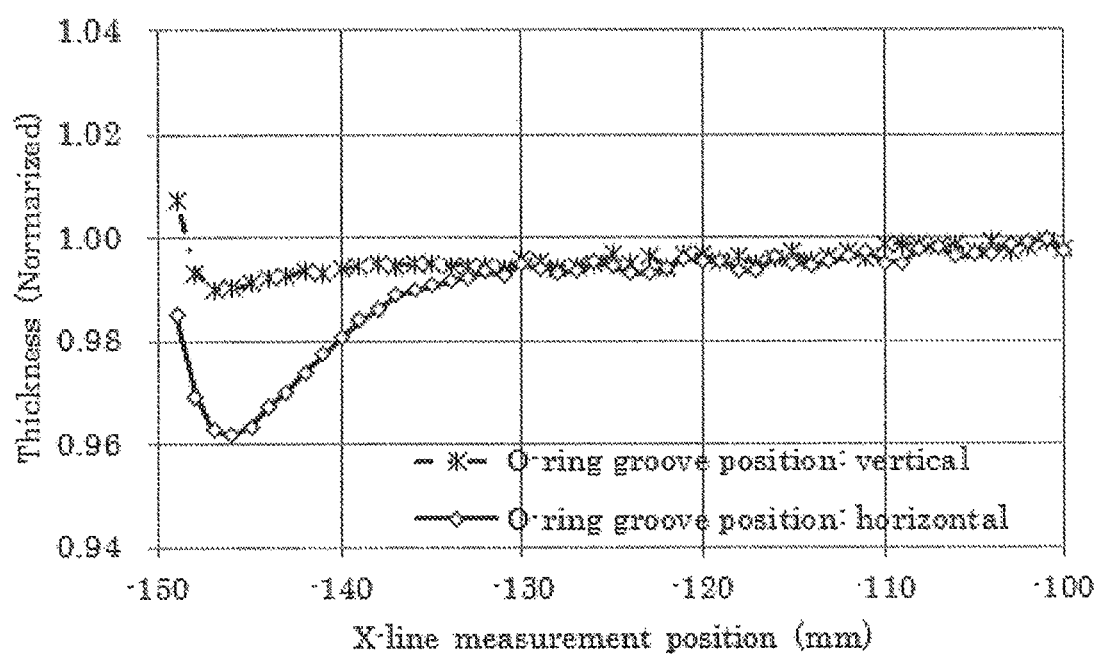
FIG. 36 is a partially expanded view of FIG. 35.
Figure 37:
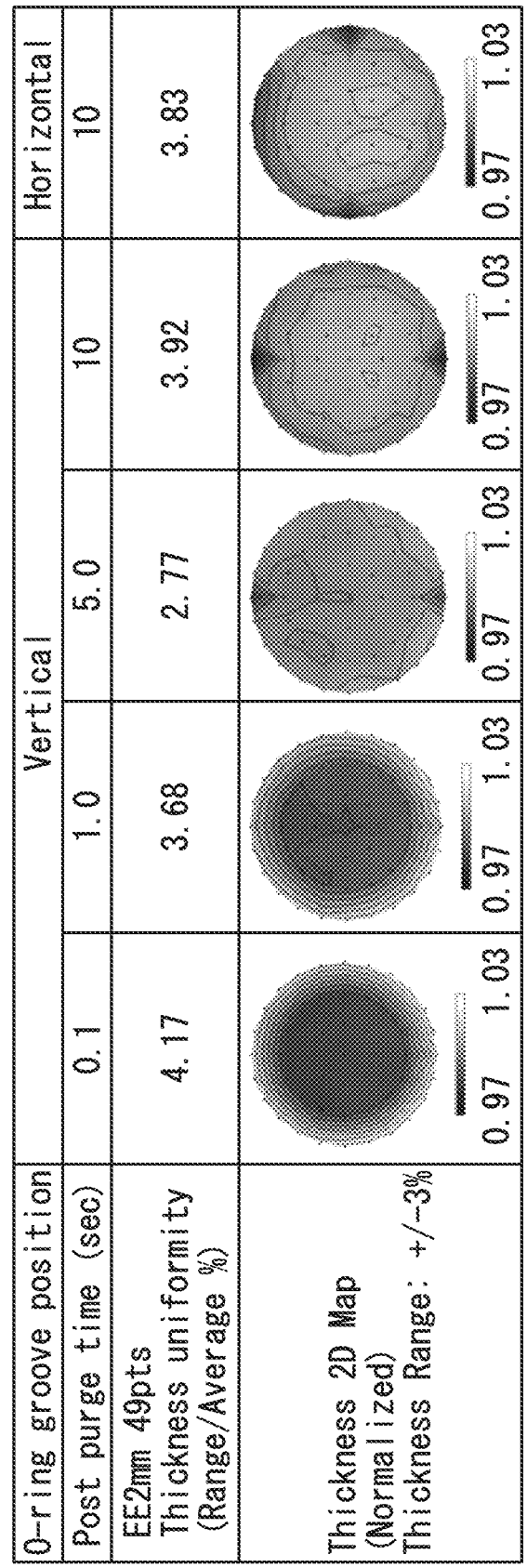
FIG. 37 is a map illustrating film thickness distributions obtained from the experiments of FIGS. 35 and 36.

FIG. 35 is a diagram illustrating a film thickness distribution along the vertical line in FIG. 32, and a film thickness distribution along the horizontal line in FIG. 32. FIG. 36 is a partially expanded view of FIG. 35. The film thickness along the horizontal line steeply decreases at the places of the O-ring grooves 34N. This is understood as the surface area of the portion of the O-ring groove 34N being larger than the surface areas of other portions on the opposing face 34a. Much material gas is adsorbed on the portion of the O-ring groove 34N, and therefore, much adsorption inhibitor can be provided right below the portion of the O-ring groove 34N. FIG. 37 is a map illustrating film thickness distributions obtained from the experiments of FIGS. 35 and 36.

Figure 38:
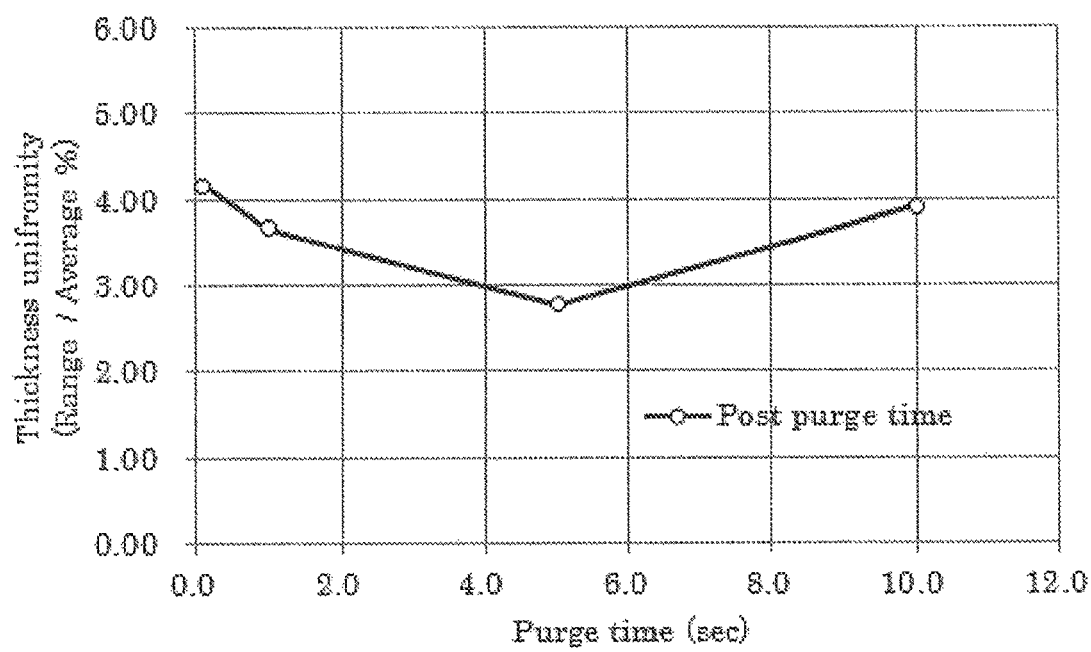
FIG. 38 illustrates the uniformity of the in-plane film thickness in the case of using the film forming apparatus having the O-ring.
Figure 39:
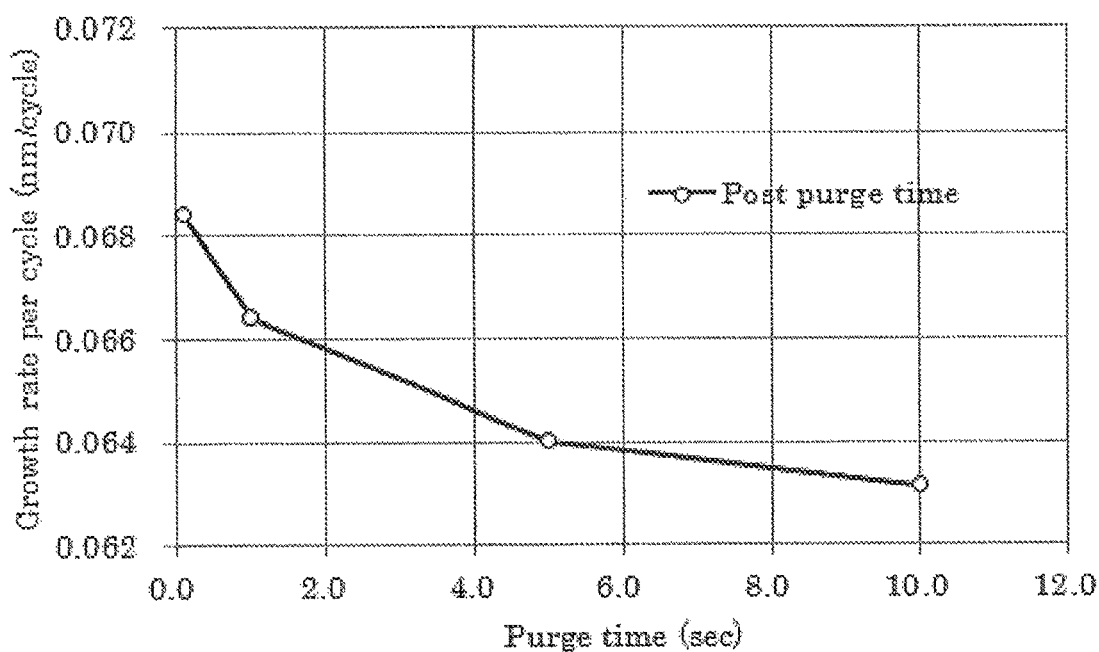
FIG. 39 illustrates the film forming rate in the case of using the film forming apparatus having the O-ring.

FIG. 38 is a diagram illustrating relation between the post-purge time and uniformity of the in-plane film thickness in the case of using the film forming apparatus having the aforementioned O-ring 60. FIG. 38 illustrates approximately the same obtained results as those in FIG. 17. FIG. 39 illustrates relation between the post-purge time and the film forming rate in the case of using the film forming apparatus having the aforementioned O-ring 60. As the post-purge time becomes longer, the amount of feed of the adsorption inhibitor to the substrate is increasing, and as a result, the film forming rate is decreasing.

Figure 40:
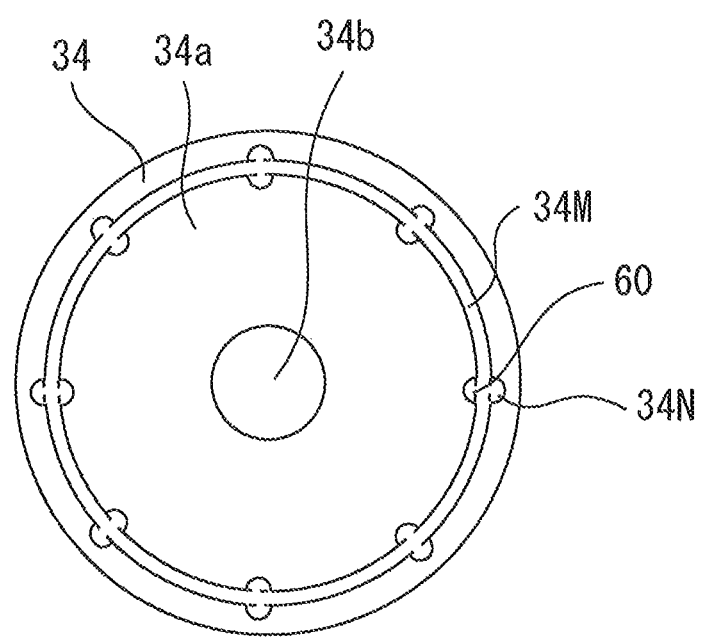
FIG. 40 is a bottom view of a gas channel according to another example.

FIG. 40 is a bottom view of a gas channel according to another example. In this example, a plurality of O-ring grooves 34N are provided annularly as a whole on the opposing face 34a. To provide three or more O-ring grooves 34N facilitates detachment of the O-ring 60, and in addition to this, enables the amount of adsorption of the material gas to be adjusted.

Another example can provide a configuration for forming a thin film on the center portion of the substrate 14 and forming a thick film on the outer portion of the substrate 14. For example, more adsorption inhibitor can be provided relatively on the center portion of the substrate 14 by heating the shower head 30 or the gas channel 34 that is positioned right above the center portion of the substrate 14 to have a higher temperature than the shower head 30 or the gas channel 34 that is positioned right above the outer portion of the substrate 14. Such a temperature distribution can be realized, for example, by changing the position of the heater. Otherwise, such a thinner film can be formed on the center portion of the substrate 14 also by making the surface area of the inner portion of the shower head 30 or the inner portion of the gas channel 34 larger than the surface areas of the outer portions of these. For example, in order to relieve an inclination on the film thickness profile in the plane of the substrate, the shower head or the gas channel that opposes a portion large in film thickness may be heated to have a high temperature or to have a large surface area.

FIGS. 41 to 46 are diagrams illustrating results of secondary ion mass spectrometry (SIMS). For this analysis, three samples were prepared. For each of the three samples, the material gas was TDMAT, the reactant gas was $O_2$ gas, and a film of $TiO_2$ was formed through plasma film formation by the ALD method. $TiO_2$ films of approximately 20 nm were formed for all the samples.

Sample 1 is a sample which was obtained at 0.1 seconds of post-purge time and 400 W of high frequency power in the step of RF. Sample 2 is a sample which was obtained at 0.1 seconds of post-purge time and 900 W of high frequency power in the step of RF. Sample 3 is a sample which was obtained at 3 seconds of post-purge time and 900 W of high frequency power in the step of RF.

Figure 41:
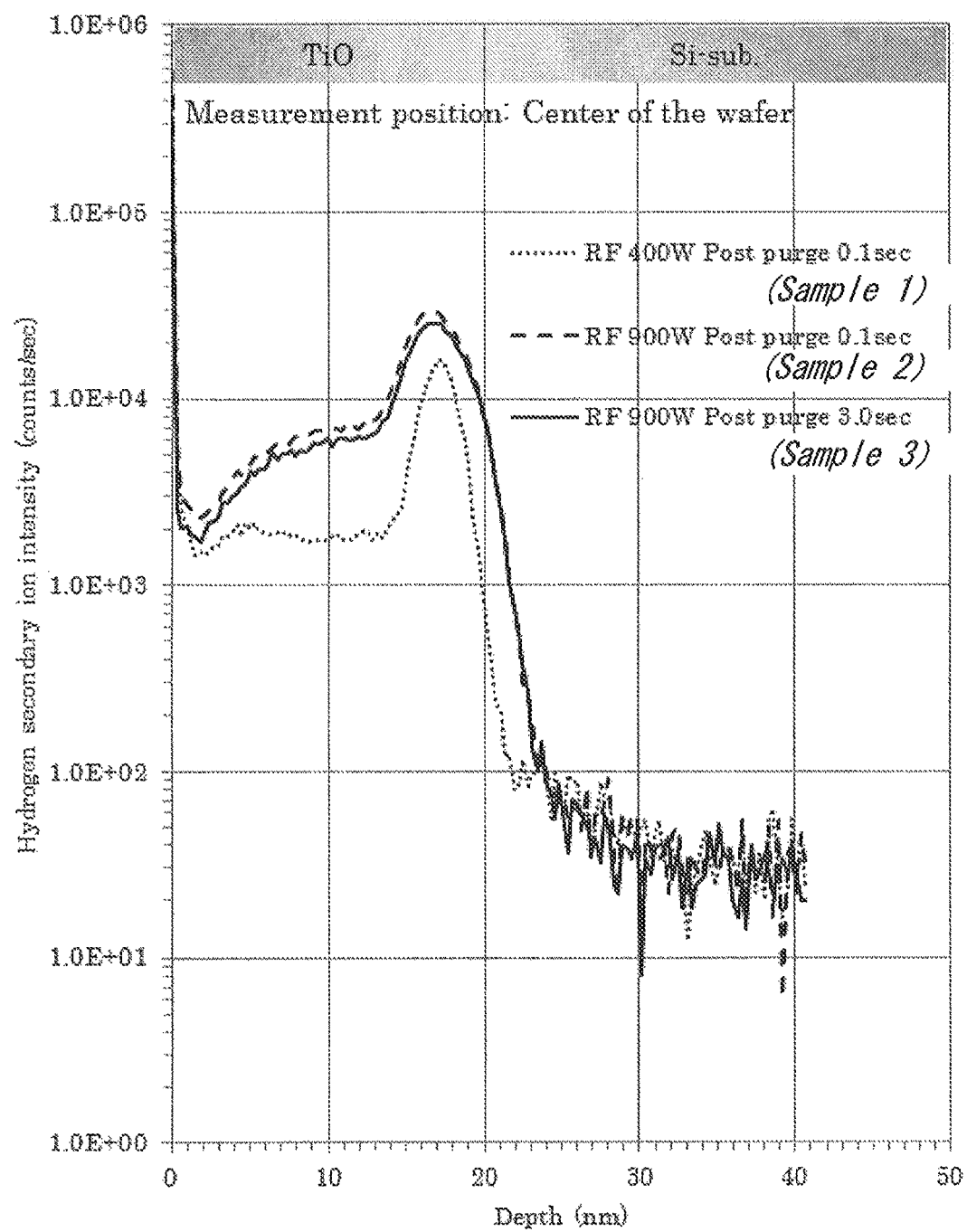
FIG. 41 illustrates distributions of the secondary ion intensities of H at the center of the substrate.
Figure 42:
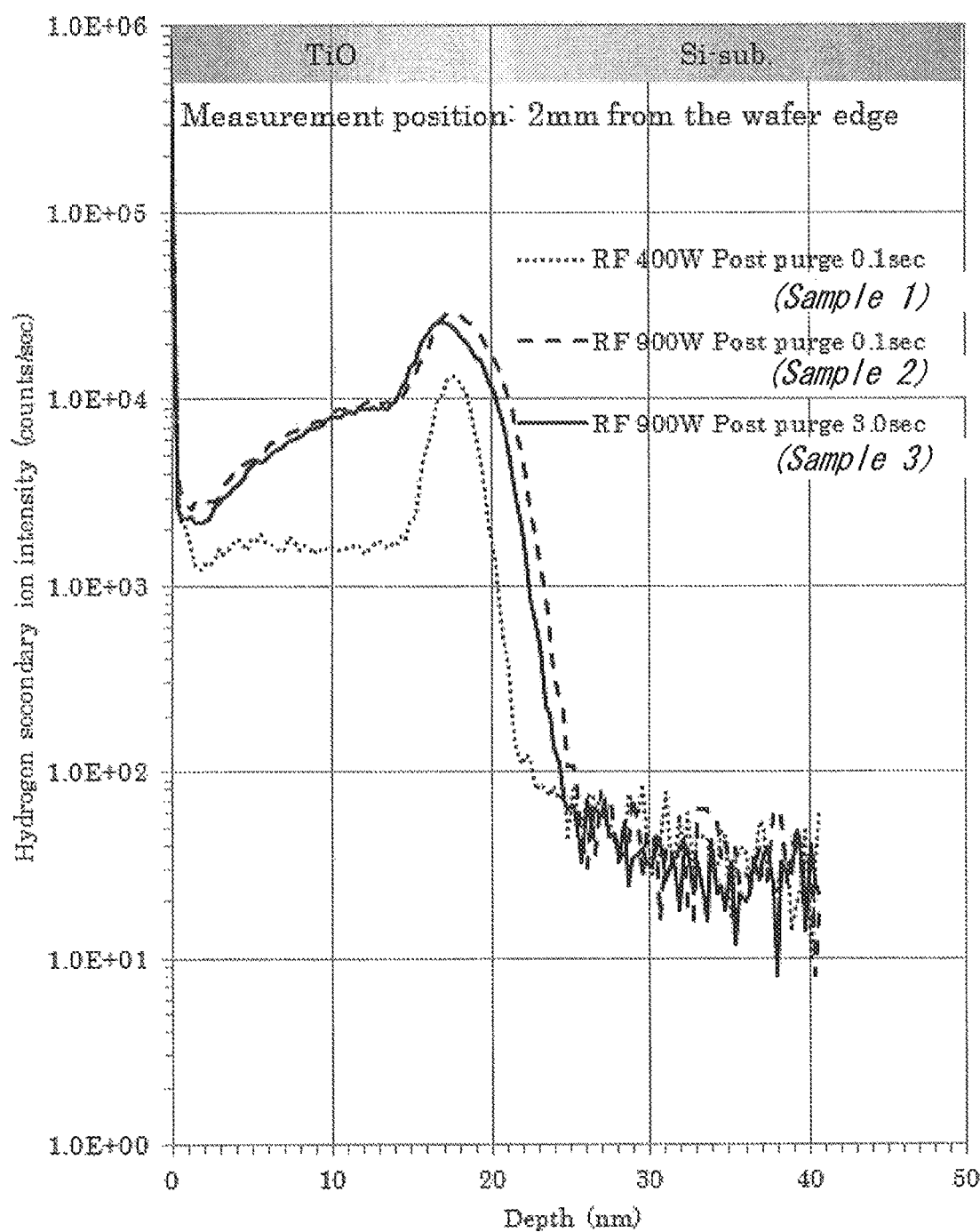
FIG. 42 illustrates distributions of the secondary ion intensities of H in the outer portion of the substrate.

FIGS. 41 and 42 illustrate distributions of the secondary ion intensities of H at the center of the substrate and in the outer portion of the substrate, respectively. It is found from comparison of samples 1 and 2 that the secondary ion intensity of H largely changes depending on the setting of the high frequency power. Meanwhile, it is found from comparison of samples 2 and 3 that the adjustment of the post-purge time little contributes to the secondary ion intensity of H at 900 W of high frequency power.

Figure 43:
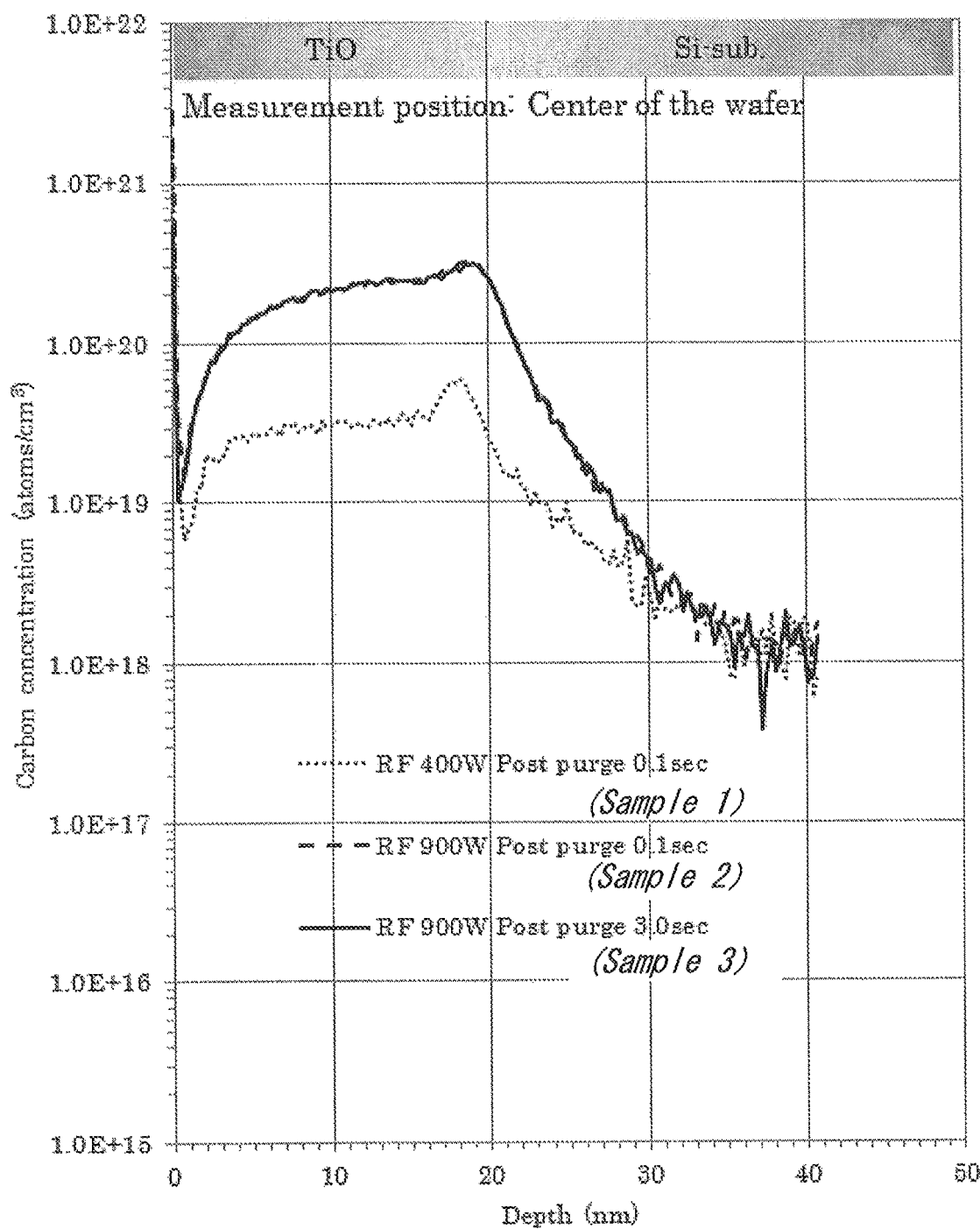
FIG. 43 illustrates distributions of C-concentrations at the center of the substrate.
Figure 44:
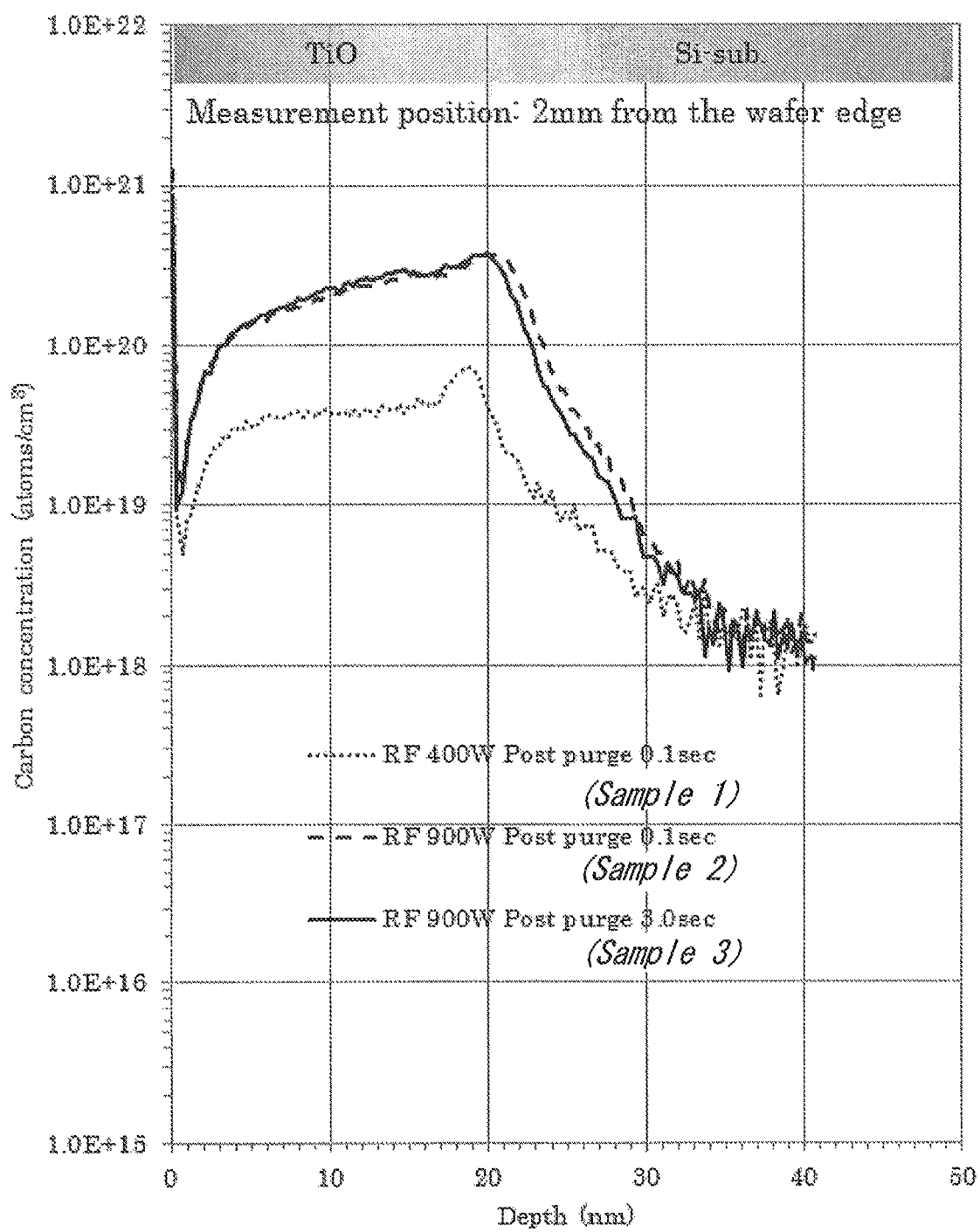
FIG. 44 illustrates distributions of C-concentrations in the outer portion of the substrate.

FIGS. 43 and 44 illustrate distributions of C-concentrations at the center of the substrate and in the outer portion of the substrate, respectively. It is found from comparison of samples 1 and 2 that the C-concentration largely changes depending on the setting of the high frequency power. Meanwhile, it is found from comparison of samples 2 and 3 that the adjustment of the post-purge time little contributes to the C-concentration at 900 W of high frequency power.

Figure 45:
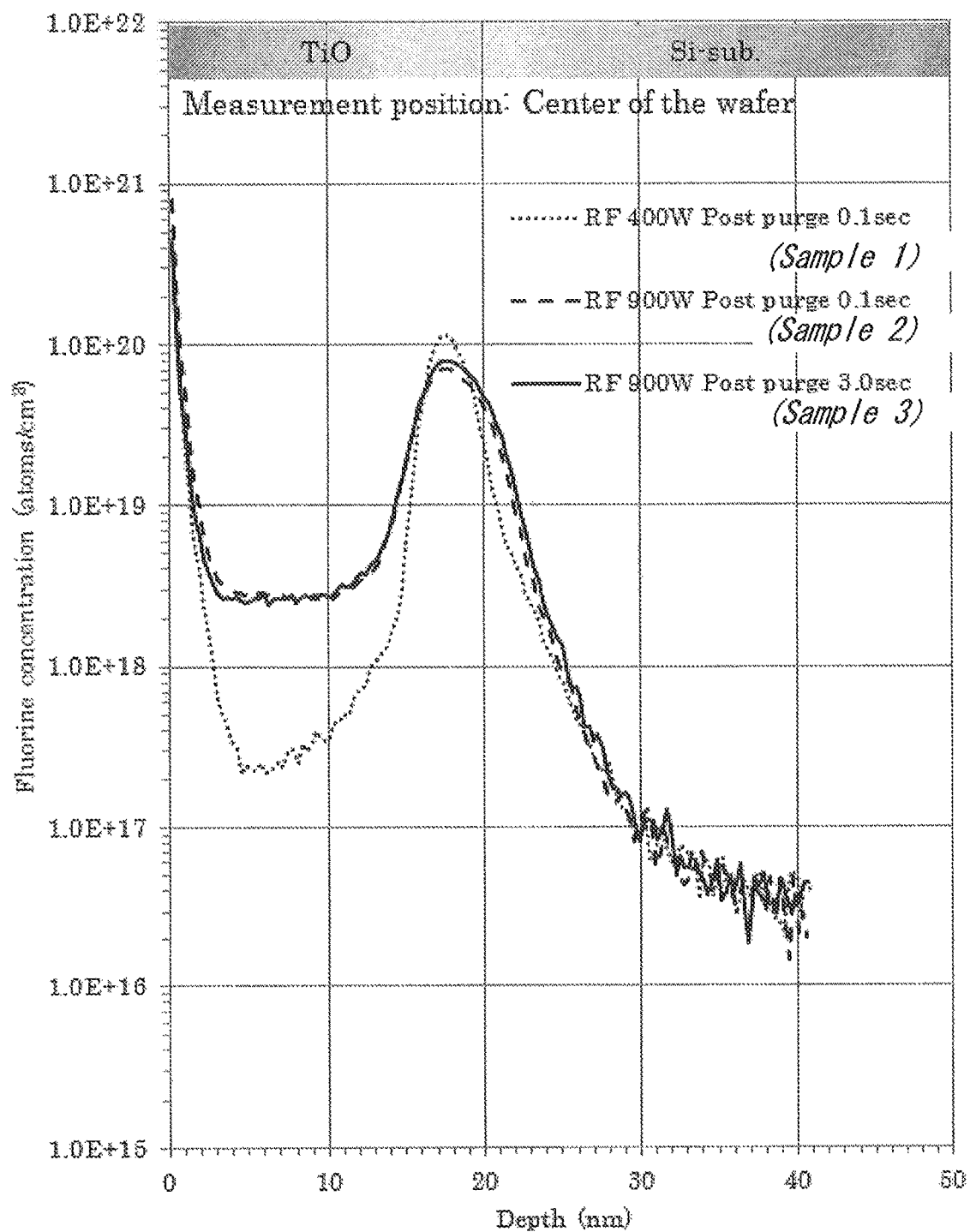
FIG. 45 illustrate distributions of F-concentrations at the center of the substrate.

FIGS. 45 and 46 illustrate distributions of F-concentrations at the center of the substrate and in the outer portion of the substrate, respectively. It is found from comparison of samples 1 and 2 that the F-concentration largely changes depending on the setting of the high frequency power. Meanwhile, it is found from comparison of samples 2 and 3 that the adjustment of the post-purge time little contributes to the F-concentration at 900 W of high frequency power. These results of SIMS indicate that the post-purge time can be adjusted while preventing or substantially preventing its influence on film quality.

For each example above, there can be changed the place where the adsorption inhibitor is generated through decomposition in post-purge. Such a place can be any component positioned upstream of the substrate out of components provided in the passage of the material gas for film formation. Specifically, the adsorption inhibitor may be generated from the material adsorbed on such a component of the gas passage, the component being positioned on the gas passage upstream of the substrate and not being exposed to the plasma to be heated in the step of post-purge.

For each example above, there can be used material gas other than TDMAT. Moreover, while in the aforementioned examples, the material gas is the source of the adsorption inhibitor, there may be employed any configuration of the apparatus in which the adsorption inhibitor can be fed regardless of the material gas.

The invention claimed is:

1. A plasma film forming method comprising:
repeating the following operations a plurality of times in the recited order:
feeding material gas onto a substrate placed on a susceptor via a shower head provided to oppose the susceptor;
performing plasma film formation on the substrate by applying high frequency power to the shower head while providing reactant gas onto the substrate; and
performing post-purge of discharging the gas used in the plasma film formation while heating the shower head, for a time longer than 0.1 seconds, such that in the post-purge, an adsorption inhibitor is provided onto the substrate through decomposition of the material gas adsorbed on a gas channel provided on the shower head or on an upper face of the shower head, and the adsorption inhibitor is localized on the substrate.

2. The plasma film forming method according to claim 1, wherein the time of the post-purge is not less than 5 seconds.

3. A plasma film forming method comprising:
repeating the following operations a plurality of times in the recited order:
feeding material gas onto a substrate placed on a susceptor via a shower head provided to oppose the susceptor;
performing plasma film formation on the substrate by applying high frequency power to the shower head while providing reactant gas onto the substrate; and
performing post-purge of discharging the gas used in the plasma film formation while heating the shower head, for a time longer than 0.1 seconds, wherein
the shower head has a gas passing part having a plurality of through holes,
a gas channel is provided on the shower head or on an upper face of the shower head, and the gas channel has an opposing face opposing the gas passing part, and
in the post-purge, an adsorption inhibitor is provided onto the substrate through decomposition of the material gas adsorbed on an upper face of the gas passing part or on the opposing face.

4. The plasma film forming method according to claim 3, wherein a heater that heats the shower head heats an outer portion of the gas passing part to have a higher temperature than an inner portion of the gas passing part.

5. The plasma film forming method according to claim 3, wherein the shower head and the gas channel are welded together, and a groove or dimples are formed on the opposing face.

6. The plasma film forming method according to claim 5, wherein the groove or the dimples are formed to be annular in plan view.

7. The plasma film forming method according to claim 3, wherein an embossment is formed on the opposing face.

8. The plasma film forming method according to claim 3, wherein the opposing face has a first portion and a second portion, and the first portion is larger in surface roughness than the second portion.

9. The plasma film forming method according to claim 3, wherein a porous material is partially formed on the opposing face.

10. The plasma film forming method according to claim 3, wherein the material gas is tetrakis (dimethylamido) titanium (TDMAT), the reactant gas is $O_2$ gas, a film of $TiO_2$ is formed in the plasma film formation, and the adsorption inhibitor contains dimethylamine.

11. The plasma film forming method according to claim 3, wherein the adsorption inhibitor is an amine-based material or a halogen-based material including a fluorine-based material.

* * * * *